United States Patent [19]
Levy et al.

[11] Patent Number: 5,789,024
[45] Date of Patent: Aug. 4, 1998

[54] SUBNANOSCALE COMPOSITE, N2-PERMSELECTIVE MEMBRANE FOR THE SEPARATION OF VOLATILE ORGANIC COMPOUNDS

[75] Inventors: Roland A. Levy, Murray Hill, N.J.; Emmanuel S. Ramos, Quezon, Philippines

[73] Assignee: New Jersey Institute of Technology, Newark, N.J.

[21] Appl. No.: 648,316

[22] Filed: May 15, 1996

[51] Int. Cl.$^6$ .............................. B05D 5/00; C23C 16/00
[52] U.S. Cl. ...................... 427/244; 427/245; 427/255.1; 427/255.2; 427/255.3; 210/490; 96/11
[58] Field of Search .................... 210/490, 500.25, 210/500.26, 651; 96/4–11; 264/45.1, 45.5, 45.6, 64; 427/244, 243, 226, 245; 501/133; 247/255.1, 255.2, 255.3

[56] References Cited

U.S. PATENT DOCUMENTS

| | | | |
|---|---|---|---|
| 4,473,476 | 9/1984 | McMillan et al. | 210/500.25 |
| 4,689,150 | 8/1987 | Abe et al. | 210/490 |
| 4,738,874 | 4/1988 | Berardo et al. | 427/244 |
| 4,814,202 | 3/1989 | Castelas | 427/244 |

(List continued on next page.)

OTHER PUBLICATIONS

Tsapatsis et aal. (1991) Ind. Eng. Chem. Res. 30:2152–2159.
Way, J.D. (1992) Separat. Sci. Tech. 27:29–41.
Nam et al. Membrane Reactor Technology, AIChE Symposium Series:p. 68 V. 85, N 268, pp. 68–74, 1989.
Megiris and Glezer (1992) Ind. Eng. Chem. Res. 31:1293–1299.
Gavalas et al. (1989) Chem. Engineer. Sci. 44(9):1829–1835.
Lin et al. (1990) Proceedings of the Eleventh International Conference on Chemical Vapor Deposition, pp. 539–545.
Grow et al. (1993) J. Electrochem. Soc. 140:3001–.
Furneaux et al. (1989) Nature 337 (6203):147–.
Havredaki and Petropoulos (1983) J. Membrane Sci. 12:303–.
Riedel and Spohr (1980) J. Membrane Sci. 7:225–.

*Primary Examiner*—Ana Fortuna
*Attorney, Agent, or Firm*—Klauber & Jackson

[57] ABSTRACT

A composite membrane is disclosed which operates as a filter for liquids, solids and gases and combinations thereof, having high permeability for the filtrate, e.g., nitrogen passing therethrough, and high selectivity for matter retained thereby, e.g., volatile organic compounds, so that the $N_2$/VOC selectivity is at least about 50/1 or greater; prepared by a low pressure chemical vapor deposition process comprising: (a) providing as a first component thereof, a mesoporous membrane substrate having pore diameters greater than about 20 Å; (b) contacting surfaces, including pore surfaces, of the membrane with at least two reactant gas streams in an opposing reactant geometry, wherein the smallest reactant gas molecule has a kinetic diameter intermediate in size between that of the matter retained by said filter and the filtrate passing therethrough; the reactant gases are capable upon reaction of depositing thereon as a second component thereof, a reaction product which by coating the surfaces, including pore surfaces of said mesoporous substrate, substantially reduces the pore diameters thereof, resulting in a substantially uniform microporous film having pore diameters in the range of from about 4 Å to about 8 Å; the reaction product comprises predominantly silicon oxide, —Si—O—, and may optionally include for the purpose of optimizing the stress, and other mechanical, chemical and thermal properties of said film, minor amounts of one or more members, in any combination thereof, selected from the group consisting of polysilicon, —Si—Si—, silicon carbide, —Si—C—, and silicon nitride, —Si—N—; and wherein said reactant gas streams comprise: (1) as the source of silicon and optionally carbide, a di-alkylsilane of the formula $R^1(R^2)SiH_2$.

5 Claims, 7 Drawing Sheets

U.S. PATENT DOCUMENTS

| | | |
|---|---|---|
| 4,874,516 | 10/1989 | Kondo . |
| 4,902,307 | 2/1990 | Gavalas et al. ............................ 95/55 |
| 4,981,570 | 1/1991 | Van 'T Veen et al. ................. 210/490 |
| 5,004,544 | 4/1991 | Hay et al. ......................... 210/500.25 |
| 5,076,926 | 12/1991 | Burggraaf et al. ................ 210/500.25 |
| 5,076,980 | 12/1991 | Nogues et al. ............................ 264/64 |
| 5,089,299 | 2/1992 | Van 'T Veen et al. . |
| 5,186,833 | 2/1993 | McHenry et al. . |
| 5,190,654 | 3/1993 | Bauer ................................. 210/500.25 |
| 5,238,569 | 8/1993 | Soria et al. . |
| 5,250,184 | 10/1993 | Maier . |
| 5,378,440 | 1/1995 | Herbst et al. ..................... 210/500.25 |
| 5,393,325 | 2/1995 | Edlund ........................................ 96/11 |
| 5,415,891 | 5/1995 | Liu et al. ................................. 427/243 |
| 5,429,743 | 7/1995 | Geus et al. ............................. 210/470 |
| 5,498,278 | 3/1996 | Edlund ........................................ 96/11 |

SUBNANOSCALE COMPOSITE, N2-PERMSELECTIVE MEMBRANE FOR THE SEPARATION OF VOLATILE ORGANIC COMPOUNDS

FIELD OF THE INVENTION

The present invention is in the field of composite membranes made from inorganic materials for the micro- and ultrafiltration of industrial and commercial mixtures, including gas separations, particularly for the prevention of undesirable emissions of volatile organic compounds, especially at elevated temperatures. Such membranes are typically asymmetric in structure, having a mesoporous region and a microporous region, and they have as their objective the separation of gases of various sizes from each other with varying degrees of selectivity and flux.

More particularly, the present invention relates to methods for making microporous membranes by low pressure chemical vapor deposition of films predominantly of silicon dioxide, optionally with minor amounts of silicon nitride, silicon carbide, boron carbonitride or related ceramic materials, within the walls of mesoporous borosilicate glass or other metal oxide composition tubes, hollow fibers, discs, or other geometric forms with an average pore size of about 40 Å and larger, so that the region of the deposited film has an average pore size of less than about 8 Å, and preferably in the range of from about 3.0 to about 5.0 Å.

BACKGROUND OF THE INVENTION

As already indicated, the present invention is concerned with the separation of gases as well as with the separation of liquids. Industrial, commercial, and environmental applications based on the separation of liquids using the composite membranes of the present invention is discussed in detail further below. The present discussion is concerned with industrial, commercial and environmental applications based on the separation of gases using the composite membranes of the present invention.

Volatile organic compounds, commonly known as VOCs, are produced in staggering quantities on a daily basis by numerous industries around the world, especially those using sequential batch processing, and the unavoidable and deliberate emission of those VOCs into the atmosphere is widespread and represents a growing threat to human health and the environment in general. VOCs in the environment may be hazardous to public health even at very low concentrations, since many of the VOCs are toxic, mutagenic, and/or carcinogenic, such as aromatic and halogenated compounds. Organic compound contaminants which are "volatile", as that term is used in the present invention, are those which have a relatively high vapor pressure and can be found in vapor form at relatively low temperatures. However, there is also included within the definition of "volatile organic compounds", as that term is used in the present invention, organic compounds which are "volatilizable", i.e., capable of being made volatile. Such volatilizable organic compounds are particularly those which may vaporize under the conditions to be found during use of the present invention.

Great effort has been poured into finding techniques and establishing technologies for meeting this menace by reducing such emissions, and many successes have resulted. However, it is strongly believed that any optimal method for drastically reducing, or altogether eliminating the emission of VOCs will include a membrane possessing such a high degree of selectivity that it will permit a gas with a small molecular size such as nitrogen, $N_2$, which has a kinetic diameter of 3.64 Å, to pass through it, while barring such passage for volatile organic compounds that may be only slightly larger in size, e.g., 5.0 Å and above. The resulting separation by such an optimal membrane will produce a high concentration of VOCs on one side of the membrane, where they can be recycled through the process in which they were generated, be diverted to another process, or destroyed by incineration or some other environmentally acceptable process.

Building on this background, the present invention has been able to accomplish the unique feat of physically separating VOCs from vent gases without using activated carbon filters, and has been able to achieve extremely low to unmeasurable residual concentrations of VOCs. The composite membranes of the present invention have the ability to handle gas streams at high pressures without breakage, in corrosive environments and at elevated temperatures.

The composite microporous membranes of the present invention will find ready applications in areas such as food processing, biotechnology, pharmaceuticals and the petrochemical industry. They can be used to separate gases, liquids, and various combination of gases and liquids. They can be used to separate the water from fruit juices without loss of larger molecules such as those which provide aroma, fruit acids, sugars, vitamins and other components.

Biological fluids of various types can be concentrated by the removal of water while retaining small peptides, hormones, nucleotides, viral particles and other biologically important compounds, using the composite microporous membranes of the present invention. The composite membranes of the present invention will find particular utility in the pharmaceutical and biomedical industries, where it is of critical importance to obtain final products which have an extraordinarily high degree of purity. The composite membranes of the present invention can be tailored with regard to their selectivity and permeability to suit the particular needs of a specific chemical, biochemical, microbiological or genetically-altered microbiological manufacturing process. These composite membranes can also be used to prepare ultrapure water, and can be used to remove pure water from waste water. They can be used for the separation of solvents, with retention of dissolved compounds such as oligomers, natural and synthetic polymers, macrocyclical and heterocyclical molecules, and other desired end products. It is also possible to tailor the composite membranes to separate desired end products of a manufacturing process from undesired or hazardous side products or contaminants.

Efforts in the past to create useful microporous membranes have focused on many different types of compositions. For example, synthetic polymers have been employed to make membrane filters, but they suffer from the significant disadvantages of not being usable at temperatures in excess of about 150° C., and of not possessing the necessary corrosion resistance and physical durability for the majority of applications. Even membranes with improved durability, such as those made of polytetrafluoroethylene, possess relatively small tensile strength per unit area compared with ceramics or metals, and soften as the ambient temperature is raised, further reducing their tensile strength. Despite the obvious drawbacks of such polymeric materials, for quite some time now the progress of membrane separation processes from lab-scale devices to well-developed industrial operations have been, almost exclusively, centered around such polymeric materials.

One reason for the prevalence of this continued effort to develop separation membranes from polymeric materials relates to one fundamental problem that characterizes all such microporous membranes, i.e., the problem of acceptably high flux or permeation rates. With increasingly small pore sizes, these membranes tend increasingly to impede the flow of gases through them, leading to unacceptably low permeation rates. As membrane components, one of the primary advantages of polymeric materials is their ability to form thin films with relative ease. A thin film or layer overcomes the problem of low permeation rate by reducing the length of the ultramicropore passages through which the gases to be separated will have the most difficulty navigating. Another reason for the continued use of polymeric materials is that the problems of mechanical integrity experienced with those materials have been alleviated to some extent by the emergence of new concepts for modular design, such as liquid and asymmetric hollow fibers. These designs have not only provided better mechanical integrity, but higher selectivity as well.

However, despite all of the advances in the design of organic polymer based microporous membranes, they are fundamentally unable to fill at least two essential niches in separation process technology: (1) high (>400° C.) temperature gas separation methods, and (2) catalytic membrane reactor methods.

In addition to thermal stability, inorganic membranes possess a number of advantageous properties which organic polymer materials cannot provide. Inorganic membranes possess structural stability and resistance to compaction swelling and inelastic deformation. They exhibit inertness toward extremely corrosive environments and are almost totally resistant to microbiological attack. Inorganic membranes are readily regenerated by backflushing, autoclaving, and steam sterilization. They provide a multiplicity of design possibilities because they can be formed from a large spectrum of different materials having a variety of individual properties, and are not restricted to a carbon-based skeleton, as in the case of organic polymers. Inorganic membranes have excited new interest in recent years, even though inorganic membranes have been well known and understood for many decades. In fact, mesoporous membranes fabricated from metal oxides were first commercialized in the large scale gas separation process by which uranium isotopes were separated based on weight differences of their hexafluoride salts.

The expressions "mesoporous" and "microporous" have already been used above, and they will continue to be used throughout the description herein, along with the additional term "macroporous". Since there is some conflicting or overlapping usage in the porous membrane art with regard to the meaning of these terms, their definitions are now set forth as follows:

"microporous"—means having an average pore size of <6 nm=<60 Å;

"mesoporous"—means having an average pore size of <10 nm=<100 Å; "macroporous"—means having an average pore size of <1000 nm=<1µ.

It is also important to point out that the composite membranes of the present invention, taken either singly or combined into a filtration unit comprising a collected multiplicity of such composite membranes, are useful in a large variety of filtration settings. They may also be altered, by suitable modifications of the process by which they are made, including importantly the reactant gases whose reaction product deposits as a microporous film on the pore surfaces of the mesoporous membrane substrate, thereby substantially reducing the pore size thereof. Such designed alterations in the pore sizes of the composite membranes of the present invention allow them to be tailored to any particular filtration requirements which may be encountered.

The composite membranes of the present invention may be employed to separate gases from gases as well as liquids from liquids. The composite membranes may also be used to separate the components of various dispersions involving mixtures of gases and liquids, e.g., liquid aerosols, emulsions, and foams.

Solids present a different problem in applying the composite membranes of the present invention. Many solids, particularly those which are dispersed or suspended in a liquid or gas medium, may be too large to be candidates for separation, as a practical matter, by the composite membranes of the present invention. For example, the lower size limit for colloidal particles is 1µ=1000 nm=10,000 Å, which is orders of magnitude larger than the average pore size of the composite membranes. The result of such attempted filtration would probably be blocking of the composite membrane, although steps may be taken to avoid this problem, e.g., by sweeping the composite membrane surface on a regular basis, or by prefiltering out the larger suspended solids. However, the composite membranes of the present invention do find highly important applications in filtering solids from liquids and gases where the solids are of an extremely small size, i.e., subnanoscale or molecular in dimensions. Such solids would actually be in solution in a liquid. The composite membranes of the present invention would thus be extremely useful in the pharmaceutical industry, where it is frequently essential to remove extremely small contaminants or side products from a batch of final product.

BRIEF DESCRIPTION OF THE PRIOR ART

U.S. Pat. No. 4,689,150 to Abe, et al. discloses a separation membrane comprising a ceramic porous support having an average pore size of 0.5µ–30µ, to which is applied a membrane of phase-separable glass particles having substantially reticular micropores with an average pore size of 10–5,000 Å, on which is formed a metallic or ceramic membrane generally by gaseous phase methods, including chemical vapor deposition, having an average pore size of about 5–2,000 Å. However, it is taught that where the average pore size is smaller than 5 Å, the gas permeation rate is so low that practicability will be demolished. Counter to this expectation, the $N_2$-permselective membrane of the present invention is able to separate gas molecules within this pore size range, and with good permeation rates.

U.S. Pat. No. 4,874,516 to Kondo discloses a ceramic filter for semi-ultrafiltration comprising a ceramic porous material substrate covered by a mesoporous membrane partly permeating the surface layer of the substrate, consisting of a high polymeric resinous material, e.g., polytetrafluoroethylene, and having an average pore size 0.1µ–0.5µ (=5,000 Å–25,000 Å). It is taught that micropores with an average size smaller than about 0.1µ are not preferable owing to their high filtration resistance as well as markedly increased blocking.

U.S. Pat. No. 4,902,307 to Gavalas et al. discloses a method for making a composite membrane by depositing a thin film of $SiO_2$ within the walls of a porous tube, e.g., Vycor® glass tubing, comprising flowing $SiH_4$ inside the tube and $O_2$ outside the tube, whereupon the reactants meet inside the tube wall where the film deposition reaction takes place. No information is provided regarding the average size of the smallest pore diameters.

U.S. Pat. No. 5,076,926 to Burggraaf et al. discloses a method for reducing the size of pores of a membrane top layer in a ceramic ultrafiltration membrane involving an aqueous solution containing urea, which is subsequently decomposed to produce a precipitated coating. The membrane layer is able to withstand temperatures as high as 450° C.

U.S. Pat. No. 5,089,299 to Van 'T Veen et al. discloses a composite ceramic micropermeable membrane comprising a porous support of any ceramic material, and a thin, smooth mesoporous layer with high and uniform permeability and a narrow pore diameter distribution, consisting preferably of aluminum oxide. Preferably, one or more subsequent mesoporous layers are added, each having a lower average pore diameter than the preceding layer, which are very thin, 1μ–10μ, and which have pores in the range of 0.5 nm–20 nm (=5 Å–200 Å), and provide a sharp filtration range and relatively high permeability.

U.S. Pat. No. 5,186,833 to Mchenry et al. discloses a composite membrane comprising a metallic support, e.g., steel, and a mesoporous ceramic membrane, e.g., alumina, deposited on the support and having pores ranging from 5 Å to 2500 Å. The mesoporous layer is produced by forming a ceramic gel on the support and thereafter calcining it.

U.S. Pat. No. 5,250,184 to Maier discloses a method for making continuous ceramic membranes with pore diameters below 1 nm (=10 Å) by e-beam evaporation of an inorganic oxide in a vacuum chamber. The starting material is heated by the e-beam until it evaporates and condenses on a suitable support. The pore size distribution of the membrane is said to be determined by the nitrogen adsorption isotherm.

U.S. Pat. No. 5,238,569 to Soria et al. discloses a filter membrane comprising a porous support, e.g., sintered ceramic or mesoporous glass, whose outside surface and inside pore surface is covered by a thin, continuous film of a polyphosphazene.

Studies have been made in the past of gas separations by high pressure, high temperature membranes based on chemical modifications of mesoporous hollow fiber silica membranes such as Vycor®. For example, Way and Roberts, "Hollow Fiber Inorganic Membranes for Gas Separations", *Separation Science and Technology*, 27(1), 29–41 (1992) discusses theories of gas motion through a mesoporous barrier, particularly silica hollow fibers including Vycor®, and concludes that both surface diffusion and molecular sieving appear to contribute to the permeability of such silica hollow fibers. It is also concluded on a preliminary basis in the absence of data on pore size distribution, that the smallest pores provide the selectivity of the separation, while the larger pores provide much of the permeability at the cost of selectivity. It is also found that gas permeability depends on molecular size and the degree that the gas molecules interact with the surface, molecules with larger surface interaction having higher permeabilities than those of a noninteracting gas of similar size.

Nam and Gavalas, "Stability of $H_2$-Permselective $SiO_2$ Films Formed by Chemical Vapor Deposition", *Membrane Reactor Technology*, discloses the production of thin $SiO_2$ films formed within the walls of porous Vycor® tubes by $SiH_4$ oxidation in an opposing reactants geometry at 450° C. in the presence and in the absence of water vapor, to give films highly selective to $H_2$ permeation having a $H_2:N_2$ ratio of about 3000:1. The films are subsequently heat treated under various conditions, and it is found that the permeation rates of $H_2$ and $N_2$ change depending on the original conditions of film formation as well as on the heat treatment conditions. However, these films are plagued by stability problems during heat treatment and in the presence of water vapor. A similar disclosure is to be found in Gavalas et al., "Deposition of $H_2$-Permselective $SiO_2$ Films", *Chemical Engineering Science*, 44(9), 1829–35 (1989); and in Tsapatsis et al., "Synthesis of Hydrogen Permselective $SiO_2$, $TiO_2$, $Al_2O_3$, and $B_2O_3$ Membranes from the Chloride Precursors", *Ind. Eng. Chem. Res.*, 30, 2152–59 (1991), which additionally discloses chloride reactants and the additional film formers set out in the title.

Films grown by silane oxidation are densified by thermal annealing, and film shrinkage is intensified in a steam atmosphere; both factors lead to a significant deterioration in permselectivity. In order to overcome these problems, Megiris and Glezer, "Synthesis of $H_2$-Permselective Membranes by Modified Chemical Vapor Deposition. Microstructure and Permselectivity of $SiO_2$/C/Vycor Membranes", *Ind. Eng. Chem. Res.*, 31, 1293–1299 (1992), uses oxidation of triisopropylsilane vapors at 750° C. and atmospheric pressure to deposit a $SiO_2$/C film on a porous Vycor® tube substrate, followed by annealing at 875° C., which has a profound effect on the hydrogen permeation rate.

Different films and mesoporous substrates, but the same deposition techniques are described in Lin et al., "Experimental Study on CVD Modification of Ceramic Membranes", *Proceedings of the Eleventh International Conference on Chemical Vapor Deposition*, 539–545 (1990). A modified CVD process operated in an opposing reactant geometry is used in which a porous substrate disc or tube separates a CVD reactor into two chambers, of which one is filled with an oxygen source reactant and the other with a metal source reactant. A film of $ZrO_2/Y_2O_3$ is deposited on a substrate such as a coarse porous α-alumina disc coated with a thin layer of porous yttria stabilized zirconia. The experimental results suggest a water concentration dependence reaction mechanism for the CVD reaction.

SUMMARY OF THE INVENTION

Figure 1:
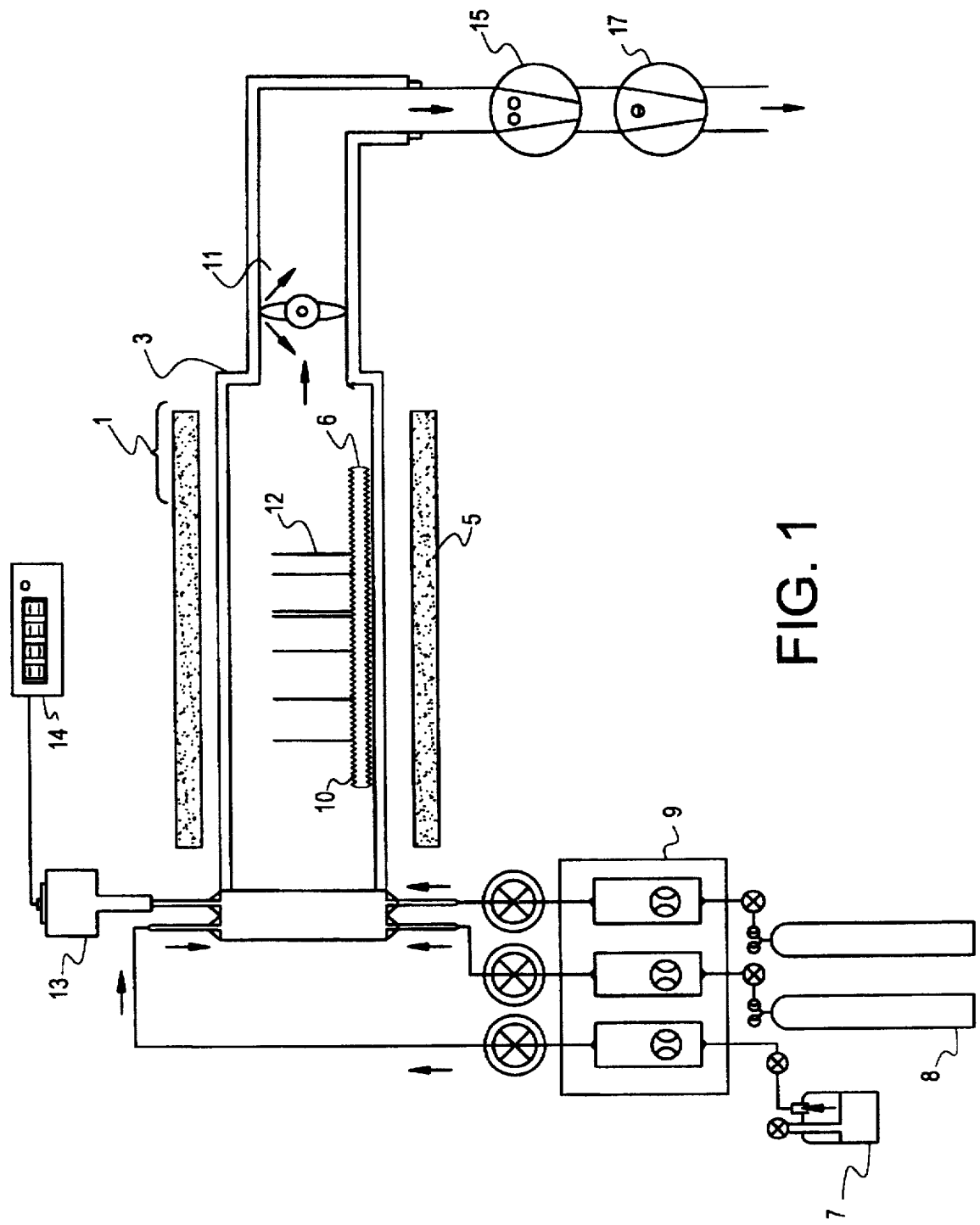
FIG. 1 is a schematic representation of a low pressure chemical vapor deposition (LPCVD) reactor apparatus of the type which has been used to deposit silicon oxide, $SiO_2$, films on borosilicate glass wafers (discs) in accordance with the present invention.

In accordance with the present invention there is provided a composite membrane filter having high permeability for the filtrate passing therethrough, and high selectivity for matter retained thereby; comprising (a) a mesoporous skeleton substrate having pores ranging in diameter from about 20 Å to about 4000 Å, made from a ceramic comprising one or more members selected from the group consisting of $Al_2O_3$, $B_2O_3$, $SiO_2$, $TiO_2$, $Y_2O_3$, and $ZrO_2$; or from a borosilicate glass; and (b) a microporous film deposited on all or a portion of the pore and other surfaces of said substrate so that the region of said deposited film has an average pore size of less than about 8 Å, said film being made from predominantly silicon oxide, —Si—O—, optionally with minor amounts of one or more members selected from the group consisting of polysilicon, —Si—Si—, silicon carbide, —Si—C—, and silicon nitride Si—N.

Further in accordance with the present invention there is provided a composite membrane having permeability for nitrogen and selectivity for volatile organic compounds, which may be entrained with said nitrogen, so that the $N_2$/VOC selectivity is at least about 50/1 or greater; comprising (a) a mesoporous skeleton substrate having pores ranging in diameter from about 20 Å to about 4000 Å, made from a ceramic comprising one or more members selected from the group consisting of $Al_2O_3$, $B_2O_3$, $SiO_2$, $TiO_2$, $Y_2O_3$, and $ZrO_2$; or from a borosilicate glass; and (b) a microporous film deposited on all or a portion of the pore and other surfaces of said substrate so that the region of said deposited film has an average pore size of less than about 8 Å, said film being made from predominantly silicon oxide, —Si—O—, optionally with minor amounts of one or more members selected from the group consisting of polysilicon, —Si—Si—, silicon carbide, —Si—C—, and silicon nitride Si—N.

There is still further provided a composite membrane as described above; wherein said composite membrane is able to withstand temperatures of up to 450° C. without suffering any significant impairment of its permeability or selectivity, and said composite membrane is substantially free of pin holes, microcracks, or other defects which can significantly impair said permeability and/or selectivity; further wherein said volatile organic compounds comprise one or more members selected from the group consisting of acetone, benzene, dichloromethane, trichloroethylene, toluene, xylene, and petroleum hydrocarbons, e.g., hexane, heptane and octane; the pores of the mesoporous skeleton substrate range in diameter from about 40 Å to about 300 Å; said substrate is a borosilicate glass predominantly comprising $SiO_2$ with a minor portion of $B_2O_3$, preferably borosilicate glass tubing of about 96% $SiO_2$ and about 3% $B_2O_3$ composition, having an average pore diameter of 40 Å, a porosity of from about 0.20 to about 0.35, preferably about 0.28, and a wall thickness of from about 0.5 mm to about 1.5 mm, preferably about 1.1 mm; said substrate is a ceramic comprising predominantly $Al_2O_3$; the region of the deposited film has an average pore size in the range of from about 4 Å to about 7 Å, preferably from about 3.0 Å to about 5.0 Å; and said microporous film is comprised of about 99% or more, by weight, of silicon oxide, —Si—O—, based on total weight of said film.

In accordance with the present invention there is provided a composite membrane filter having high permeability for the filtrate passing therethrough, and high-selectivity for matter retained thereby; prepared by a low pressure chemical vapor deposition process comprising (a) providing as a first component thereof, a mesoporous membrane substrate having pore diameters greater than about 20 Å; (b) contacting surfaces, including pore surfaces, of said membrane with at least two reactant gas streams in an opposing reactant geometry, wherein the smallest reactant gas molecule has a kinetic diameter intermediate in size between that of the matter retained by said filter and the filtrate passing therethrough, and wherein said reactant gases are capable upon reaction of depositing thereon as a second component thereof, a reaction product which by coating the surfaces, including pore surfaces of said mesoporous substrate, substantially reduces the pore diameters thereof, resulting in a substantially uniform microporous film having pore diameters in the range of from about 4 Å to about 8 Å; wherein said reaction product comprises predominantly silicon oxide, —Si—O—, and may optionally include for the purpose of optimizing the stress, and other mechanical, chemical and thermal properties of said film, minor amounts of one or more members, in any combination thereof, selected from the group consisting of polysilicon, —Si—Si—, silicon carbide, —Si—C—, and silicon nitride, —Si—N—; and wherein said reactant gas streams comprise (1) as the source of silicon and optionally carbide, a di-alkylsilane of the formula $R^1(R^2)SiH_2$, where $R^1$ and $R^2$ are independently selected from $C_{1-6}$alkyl, e.g., methyl, ethyl, n-propyl, iso-propyl, n-butyl, sec-butyl, tert-butyl, n-pentyl, and n-hexyl; (2) as the source of oxide, oxygen, $O_2$, or an oxide of nitrogen comprising one or more members selected from the group consisting of nitrous oxide, $N_2O$, nitric oxide, NO, nitrogen dioxide, $NO_2$, and nitrogen trioxide, $N_2O_3$; and optionally (3) as the source of nitride, ammonia or reactive nitrogen-containing gas.

In accordance with the present invention there is further provided a composite membrane having permeability for nitrogen and selectivity for volatile organic compounds, which may be entrained with said nitrogen, so that the $N_2$/VOC selectivity is at least about 50/1 or greater; prepared by a low pressure chemical vapor deposition process comprising (a) providing as a first component thereof, a mesoporous membrane substrate having pore diameters greater than about 20 Å; (b) contacting surfaces, including pore surfaces, of said membrane with at least two reactant gas streams in an opposing reactant geometry, wherein the smallest reactant gas molecule has a kinetic diameter intermediate in size between that of VOCs and permeant gases, and wherein said reactant gases are capable upon reaction of depositing thereon as a second component thereof, a reaction product which by coating the surfaces, including pore surfaces of said mesoporous substrate, substantially reduces the pore diameters thereof, resulting in a substantially uniform microporous film having pore diameters in the range of from about 4 Å to about 8 Å; wherein said reaction product comprises predominantly silicon oxide, —Si—O—, and may optionally include for the purpose of optimizing the stress, and other mechanical, chemical and thermal properties of said film, minor amounts of one or more members, in any combination thereof, selected from the group consisting of polysilicon, —Si—Si—, silicon carbide, —Si—C—, and silicon nitride, —Si—N—; and wherein said reactant gas streams comprise (1) as the source of silicon and optionally carbide, a di-alkylsilane of the formula $R^1(R^2)SiH_2$, where $R^1$ and $R^2$ are independently selected from $C_{1-6}$alkyl, e.g., methyl, ethyl, n-propyl, isopropyl, n-butyl, sec-butyl, tert-butyl, n-pentyl, and n-hexyl; (2) as the source of oxide, oxygen, $O_2$, or an oxide of nitrogen comprising one or more members selected from the group consisting of nitrous oxide, $N_2O$, nitric oxide, NO, nitrogen dioxide, $NO_2$, and nitrogen trioxide, $N_2O_3$; and optionally (3) as the source of nitride, ammonia or reactive nitrogen-containing gas.

There is further provided a composite membrane as described above wherein said mesoporous membrane substrate is a borosilicate glass having an average pore diameter of about 40 Å; the reactant gases are nitrous oxide, $N_2O$, and either diethylsilane (DES), $SiH_2(C_2H_5)_2$, or di-t-butylsilane (DTBS), $SiH_2[C(CH_3)_3]_2$; the reaction product comprises 99% by weight silicon oxide, —Si—O—, based on the total weight of said microporous film; and said microporous film has pore diameters in the range of from about 3.0 Å to about 5.0 Å.

In accordance with the present invention there is further provided a composite membrane having permeability for nitrogen and selectivity for volatile organic compounds, which may be entrained with said nitrogen, so that the $N_2$/VOC selectivity is at least about 50/1 or greater; prepared by a low pressure chemical vapor deposition process comprising (a) providing as a first component thereof, a mesoporous membrane substrate having pore diameters in the range of from about 30 Å to about 3000 Å and maintaining said substrate and an area about it at a temperature in the range of from about 350° to about 650° C., and at a pressure in the range of from about 400 mTorr to about 600 mTorr; (b) contacting surfaces, including pore surfaces, of said substrate with reactant gas streams capable upon reaction of depositing thereon as a second component thereof, a reaction product which by coating the surfaces, including pore surfaces of said mesoporous substrate, substantially reduces the pore diameters thereof, resulting in a substantially uniform microporous film having pore diameters in the range of from about 4 Å to about 7 Å; wherein said reaction product comprises predominantly silicon oxide, —Si—O—, and may optionally include for the purpose of optimizing the stress, and other mechanical, chemical and thermal properties of said film, minor amounts of one or more members, in any combination thereof, selected from the group consisting of polysilicon, —Si—Si—, silicon carbide, —Si—C—, and silicon nitride, —Si—N—; and wherein said reactant gas streams comprise (1) as the source of silicon and optionally carbide, a di-alkylsilane of the formula $R^1(R^2)SiH_2$, where $R^1$ and $R^2$ are independently selected from $C_{1-6}$alkyl, e.g., methyl, ethyl, n-propyl, iso-propyl, n-butyl, sec-butyl, tert-butyl, n-pentyl, and n-hexyl; (2) as the source of oxide, oxygen, $O_2$, or an oxide of nitrogen comprising one or more members selected from the group consisting of nitrous oxide, $N_2O$, nitric oxide, NO, nitrogen dioxide, $NO_2$, and nitrogen trioxide, $N_2O_3$; and optionally (3) as the source of nitride, ammonia or reactive nitrogen-containing gas.

In accordance with the present invention there is provided a composite membrane filter having high permeability for the filtrate passing therethrough, and high selectivity for matter retained thereby; prepared by a low pressure chemical vapor deposition process comprising (a) providing as a first component thereof, a mesoporous membrane substrate having pore diameters in the range of from about 30 Å to about 3000 Å and maintaining said substrate and an area about it at a temperature in the range of from about 350° to about 650° C., and at a pressure in the range of from about 400 mTorr to about 600 mTorr; (b) contacting surfaces, including pore surfaces, of said substrate with reactant gas streams capable upon reaction of depositing thereon as a second component thereof, a reaction product which by coating the surfaces, including pore surfaces of said mesoporous substrate, substantially reduces the pore diameters thereof, resulting in a substantially uniform microporous film having pore diameters in the range of from about 4 Å to about 7 Å; wherein said reaction product comprises predominantly silicon oxide, —Si—O—, and may optionally include for the purpose of optimizing the stress, and other mechanical, chemical and thermal properties of said film, minor amounts of one or more members, in any combination thereof, selected from the group consisting of polysilicon, —Si—Si—, silicon carbide, —Si—C—, and silicon nitride, —Si—N—; and wherein said reactant gas streams comprise (1) as the source of silicon and optionally carbide, a di-alkylsilane of the formula $R^1(R^2)SiH_2$, where $R^1$ and $R^2$ are independently selected from $C_{1-6}$alkyl, e.g., methyl, ethyl, n-propyl, iso-propyl, n-butyl, sec-butyl, tert-butyl, n-pentyl, and n-hexyl; (2) as the source of oxide, oxygen, $O_2$, or an oxide of nitrogen comprising one or more members selected from the group consisting of nitrous oxide, $N_2O$, nitric oxide, NO, nitrogen dioxide, $NO_2$, and nitrogen trioxide, $N_2O_3$; and optionally (3) as the source of nitride, ammonia or reactive nitrogen-containing gas.

There is further provided a composite membrane as described above wherein the mesoporous membrane substrate is borosilicate glass tubing which has an average pore diameter of about 40 Å; said substrate and an area about it are maintained at a temperature in the range of from about 400° to about 500° C., and at a pressure in the range of from about 450 mTorr to about 550 mTorr; said substantially uniform microporous film has pore diameters in the range of from about 3.0 Å to about 5.0 Å; the di-alkylsilane reactant gas is a member selected from the group consisting of diethylsilane (DES), $SiH_2(C_2H_5)_2$ and di-t-butylsilane (DTBS), $SiH_2[C(CH_3)_3]_2$; the source of oxide is nitrous oxide, $N_2O$; and optionally, the source of nitride is $NH_3$.

In accordance with the present invention there is also provided a low pressure chemical vapor deposition process utilizing opposing reactant geometry, for preparing a tubular composite membrane filter comprising a mesoporous borosilicate glass substrate and deposited microporous film predominantly of silicon oxide and optionally silicon carbide or silicon nitride for the purpose of optimizing the stress and other mechanical, chemical, and thermal properties of said composite membrane, having high permeability for the filtrate passing therethrough, and high selectivity for matter retained thereby, as well as having permeability for nitrogen and selectivity for volatile organic compounds which may be entrained with said nitrogen, comprising (a) providing a tubular, borosilicate glass, mesoporous substrate having pore diameters in the range of from about 30 Å to about 3000 Å; (b) maintaining said substrate and areas both inside and outside of it at a temperature in the range of from about 350° to about 650° C., and at a pressure in the range of from about 400 mTorr to about 600 mTorr; (c) contacting inside surfaces, including pore surfaces, of said tubular mesoporous substrate with a reactant gas stream comprising oxygen, $O_2$, or an oxide of nitrogen comprising one or more members selected from the group consisting of nitrous oxide, $N_2O$, nitric oxide, NO, nitrogen dioxide, $NO_2$, and nitrogen trioxide, $N_2O_3$; and optionally, ammonia or reactive nitrogen-containing gas; and at the same time (d) contacting outside surfaces, including pore surfaces, of said tubular mesoporous substrate with a reactant gas stream comprising diethylsilane (DES), $SiH_2(C_2H_5)_2$ or di-t-butylsilane (DTBS), $SiH_2[C(CH_3)_3]_2$; (e) causing said reactant gas streams to meet within said pores of said tubular substrate, to react, and to deposit thereon a reaction product which by coating the surfaces, including pore surfaces of said mesoporous substrate, substantially reduces the pore diameters thereof, resulting in a substantially uniform microporous film having pore diameters in the range of from about 4 Å to about 7 Å; said reaction product comprising predominantly silicon oxide, —Si—O—, and may optionally include for the purpose of optimizing the stress, and other mechanical, chemical and thermal properties of said film, minor amounts of one or more members, in any combination thereof, selected from the group consisting of polysilicon, —Si—Si—, silicon carbide, —Si—C—, and silicon nitride, —Si—N—.

There is further provided a process as described above wherein said borosilicate glass tubular mesoporous substrate has an average pore diameter of about 40 Å; said substrate and an area about it are maintained at a temperature in the range of from about 400° to about 500° C., and at a pressure in the range of from about 450 mTorr to about 550 mTorr; said substantially uniform microporous film has pore diameters in the range of from about 3.0 Å to about 5.0 Å; the source of nitride is $NH_3$; and the source of oxide is nitrous oxide, $N_2O$.

DETAILED DESCRIPTION OF THE INVENTION

The composite membranes and methods of the present invention are based on the discovery that the kinetic diameter of the molecules of the oxidizing reactant gas used in making microporous films is critical to achieving the selectivity and permeability for efficient separation of VOCs and permeant gases such as nitrogen. Pursuant to this discovery, the oxidizing reactant gas is chosen so that its molecules are larger than those of oxygen, $O_2$, typically used in prior art methods, and more particularly, so that they have a kinetic diameter intermediate in size between that of VOCs and permeant gases. When this requirement is met, the reaction which takes place between the oxidizing reactant gas and the reactant gas which is the source of silicon for the microporous film, becomes self-limiting. This is based on the mechanism of deposition by which $SiO_2$ is deposited to form a silicon oxide, —Si—O—, film within the pores of the mesoporous substrate. The process of film deposition leads to shrinking diameters in the pores of the substrate, and when these pore diameters approach the size of the kinetic diameter of the smallest precursor molecule, the reactants cannot make contact, no further reactions are possible, and deposition ceases. In this way the deposition process becomes automatically self-terminating.

The pore size of the microporous film is determined by the kinetic diameter of the smallest precursor molecule, which will usually be the oxidizing reactant gas. The pore diameters must be intermediate in size between the kinetic diameter of permeant gases such as nitrogen, and those of VOCs which are being separated. Thus, oxygen cannot be used, since its kinetic diameter is too close to that of nitrogen and other permeant gases. Also, the reactant gas which is the source of silicon will usually be larger than any available oxidizing gases, and thus cannot be used as well. Consequently, the oxidizing reactant gas will usually be the pore diameter determining factor, so that the resulting pore size of the microporous film is approximately the same as that of the kinetic diameter of the oxidizing reactant gas molecules. The preferred oxidizing reactant gas is nitrous oxide, $N_2O$, since the kinetic diameter of its molecules is larger than that of permeant gas molecules, and smaller than that of the molecules of common VOCs. Permeant gases include, e.g., nitrogen, $N_2$, oxygen, $O_2$, carbon dioxide, $CO_2$, carbon monoxide, CO, hydrogen, $H_2$, helium, He, and argon, Ar, while common VOCs include, e.g., acetone, benzene, dichloromethane, trichloroethylene, toluene, xylene, and petroleum hydrocarbons, e.g., hexane, heptane and octane. In this way, the reactant gases are capable upon reaction of depositing on the mesoporous substrate as a second component thereof, a reaction product comprising a substantially uniform microporous film having pore diameters in the range of from about 4 Å to about 8 Å, more particularly, from about 3.0 Å to about 5.0 Å.

Nitrous oxide, $N_2O$, is preferred as the oxidizing reactant gas in the methods of the present invention because the kinetic diameter of its molecules is of the desired magnitude compared to the kinetic diameters of most permeant gases and VOCs which one would be likely to desire to separate. Furthermore, nitrous oxide is safe, inexpensive, and commercially available in quantity. However, other gaseous oxides of nitrogen are also available for use in making the composite membranes of the present invention, and include nitric oxide, NO, nitrogen dioxide, $NO_2$, and nitrogen trioxide, $N_2O_3$.

Therefore, in accordance with the present invention there is provided a method for microengineering the subnanoscale pore structure of silicon oxide, —Si—O—, films deposited on porous ceramic and borosilicate glass substrates in order to provide a wide range of selectivity for volatile organic compounds, with high permselectivity and permeability for nitrogen and 4 other permeant gases. The present invention is also concerned with the composite membrane which is produced when that method is carried out. The method and composite membrane produced thereby begin with the porous ceramic or borosilicate glass substrate, which is used as the foundation material to provide mechanical strength and resistance to heat and chemical attack, and to provide a mesoporous skeleton for construction of the composite membrane. The mesoporous skeleton becomes the basis for adequate permeability in the final composite membrane; and the silicon oxide, —Si—O—, film which is deposited in those micropores to create a microporous layer upon and within the mesoporous skeleton, becomes the basis for acceptable selectivity in the final composite membrane.

Thus, the composite membranes of the present invention require a support material with the following characteristics: (a) the ability to maintain its structural and mechanical integrity over a reasonably wide range of high temperatures and pressures; (b) large surface areas with mesopores providing high inherent permeabilities; (c) a narrow pore size distribution; (d) a structure which is free of pin holes, microcracks and other defects; and (e) the ability to withstand property degradation in corrosive environments. All of these requirements are satisfied by the porous ceramic and borosilicate glass substrates used in the methods and composite membranes of the present invention.

The porous ceramic substrates which are suitable for use as substrates in making the composite membranes of the present invention comprise homogeneous, crystalline, non-metallic mineral compounds consisting of oxides and fluorides of boron, B, calcium, Ca, magnesium, Mg, aluminum, Al, silicon, Si, phosphorous, P, strontium, Sr, yttrium, Y, and zirconium, Zr, such as $Al_2O_3$, $B_2O_3$, $SiO_2$, $TiO_2$, $Y_2O_3$, and $ZrO_2$. A preferred porous ceramic material is aluminum oxide, $Al_2O_3$. These porous ceramic materials are used to form a mesoporous skeleton substrate having pores ranging in diameter from about 20 Å to about 4000 Å. These porous ceramic materials are typically fabricated into the form of plates and discs.

The porous borosilicate glass substrate used in the method and composite membrane of the present invention is commercially available in a wide variety of forms which include hollow fibers, capillary bundles, tubings, plates and discs. By selecting the appropriate porous substrate form, a very high membrane surface area per unit volume may be achieved, allowing creation of compact ultrafiltration devices than can remove volatile organic compound streams from commercial and industrial effluent, and are reusable over substantial periods of time. A suitable porous borosilicate glass material is that produced by Corning Glass, Inc. as Vycor®, e.g., Porous Glass #7930, which is 96% $SiO_2$ and 3% $B_2O_3$ with an average pore diameter of 40 Å and a 0.28 void fraction, i.e., porosity. It is available in suitable tubing sizes, e.g., with a 5 mm inside diameter and a 1.1 mm wall thickness; a 7 mm outside diameter and a 4.8 mm inside diameter; or a 17 mm outside diameter and 14.4 mm inside diameter. The average pore diameter for porous borosilicate glass compositions varies from approximately 40 Å to 300 Å, depending on the initial concentration of the boron rich phase during preparation of the borosilicate glass. Borosilicate glasses generally have a working temperature range of up to about 800° C. They are steam sterilizable, mechanically and chemically stable under cleaning conditions, biologically inert, and relatively less expensive than other candidate substrate materials with equivalent properties. All of these characteristics make the porous borosilicate glasses a highly preferable choice for the mesoporous skeleton from which to make the composite ultrafiltration membranes of the present invention.

Porous borosilicate glasses are unique in exhibiting a surface diffusion mechanism for the transport of gas molecules through their porous membrane structures. For mesoporous barriers with pores small enough to ignore forced convective flow, such as those used in the present inventions there are four separate mechanisms of transport which may occur. The first is Knudsen diffusion, in which the ratio of the flow of species A to that of species B is given by the inverse of the square root of their molecular weight ratio. Because molecular weights of gaseous species of interest do not vary extensively, selectivities are small and efficient separation is rare. No chemical information on the makeup of the gases or the membrane are necessary to calculate the flux. The second mechanism is surface diffusion and refers to the ability of the gas molecules to reside on the surface and hop from point to point along the surface of the membrane, with no apparent residence time in the bulk gas phase above that surface. The surface chemistry of the microporous film coating on the pores of the mesoporous membrane substrate plays a key role in this mechanism, and surface diffusion essentially occurs when the energy state of the diffusing species is dominated by its interaction with that surface. Surface diffusion occurs regardless of membrane pore size, but is negligible when transport through the bulk of the pore is dominant. Accordingly, the average pore size of the membrane must be much less than 10 Å before surface diffusion will become a significant factor in gas flow through the membrane.

The third transport mechanism is capillary condensation with liquid flow, which is not relevant to an understanding of the present invention; and the fourth mechanism is molecular sieving. As the name suggests, molecular sieving refers to the complete blocking of transport of a certain size or shape of molecule by the membrane, and the free passage of smaller or differently shaped molecules therethrough. In true molecular sieving, the diffusing molecule is in close and regular contact with virtually all sides of the pore wall. In zeolites, which strongly and clearly exhibit the molecular sieving property, the pore wall is effectively the aperture to the inner zeolite cage. In a mesoporous/microporous membrane, on the other hand, a diffusing gas molecule will encounter a variety of such apertures as it diffuses across the membrane, as a consequence of the membrane being a three-dimensional structure which is nonuniform in its pore size distribution. In such an irregular, heterogeneous array of interconnected pores, it may well be that a diffusing gas species will encounter a variety of constrictions in which the molecular sieving mechanism is dominant, while encountering other regions where the dominant transport mechanisms are surface diffusion or Knudsen diffusion. Where the pore size of the membrane is from 2 Å–3 Å, the molecular sieving mechanism will control transport of the gas species. The following equation for this transport or flux has been derived, and is in common use:

$$N_{i,pore} = -D_i \frac{dC_i}{dx} - D^s_i \rho_s (1-\epsilon) RT \sum_{j=i}^{N} \left( \frac{\partial n_i}{\partial P_j} \frac{dC_j}{dx} \right)$$

$N_{i,pore}$ is the flux of species i in moles per unit of pore area per unit of time. $D^s_i$, is the surface diffusion coefficient, $\rho_s$, is the density of the native solid membrane material, $\epsilon$ is the void volume fraction in the mesoporous membrane, R is the gas constant, T is the absolute temperature, $n_i$ is the number of moles of species i adsorbed on the internal pore surface per unit of mass of the absorbent material, i.e., the mesoporous membrane. $D_i$ is the diffusion coefficient of species i in the internal pore gas phase, $P_j$ is the partial pressure of any gas species j in the internal pore gas phase, $C_i$ and $C_j$ are the concentrations of species i and j in the internal pore gas phase, and N is the number of species in the multicomponent mixture.

Another critical element of the composite membrane of the present invention is the composition of the microporous film. Preferred is a silicon-based film applied to a porous borosilicate glass skeleton. Silicon-dioxide exhibits superior thermal, mechanical, and chemical properties, as described, e.g., in Levy et al., *Materials Science and Engineering*, B17(1993) 172–180. The oxide of silicon, in the form of a deposited film, exhibits excellent compressive strength, which means that the film will be resistant to breaking and cracking. The carbides and nitrides of silicon, possess good tensile strength, but tend to be brittle, and thus less desirable. However, they may be used in minor amounts in forming the mesoporous ceramic substrates, either for reasons relating to a desired improvement in the stress characteristics and other mechanical, chemical and thermal properties of the deposited film ultimately produced, or for reasons relating to efficiency of production, in accordance with which it is less costly to allow minor amounts of carbide and nitride to be present than to endeavor to remove them, while the properties of the final film deposited are not seriously impaired.

The composite membrane of the present invention is made by a process of low pressure chemical vapor deposition (LPCVD) described in detail further below. The major LPCVD process variables which influence micropore structure, i.e., size and distribution, include temperature, mass flow rates of the reactant gases, reactant gas composition, and total pressure. Thus, the chemical composition of the silicon-based film plays a critical role in the outcome. Accordingly, it has been found that excellent results are achieved with the use of di-alkylsilanes of the formula: $R^1(R^2)SiH_2$, where $R^1$ and $R^2$ are independently selected from $C_{1-6}$alkyl, e.g., methyl, ethyl, n-propyl, iso-propyl, n-butyl, sec-butyl, tert-butyl, n-pentyl, and n-hexyl. A preferred di-alkylsilane reactant gas is diethylsilane (DES), $SiH_2(C_2H_5)_2$. DES is preferable to silane, $SiH_4$, because it is safer and produces films which have superior conformality, lower particulate contamination, and higher stress and crack resistance. The pertinent properties of DES are set out in the following table:

TABLE 1

| Chemical name | Diethylsilane (DES) |
|---|---|
| Chemical formula | $SiH_2(C_2H_5)_2$ |
| General Name | Organo-Hydro Silane |
| Molecular Weight | 88.2 g/mole |
| Appearance | Colorless liquid |
| Solubility in water | Insoluble |
| Autoignition temperature | 218° C. |
| Normal boiling point | 56° C. |
| Flash point | −20° C. (closed cup) |
| Freezing point | < −76° C. (at 1 atm.) |
| Density | 0.6843 g/cm$^3$ (@ 20° C.) |
| Vapor density (air = 1) | >1 |
| Vapor pressure | 207 Torr (@ 20° C.) |

Di-t-butylsilane (DTBS) is also preferred as the reactant gas, which basically forms a silicon oxide film in the presence of nitrous oxide or nitrogen oxide gases, while optionally, silicon carbide, SiC can be formed, and in the presence of $NH_3$ silicon nitride, $Si_3N_4$, can also be formed, and in the properties of DTBS are set out in the Table below:

TABLE 2

| Chemical name | Di-t-butylsilane (DTBS) |
|---|---|
| Chemical formula | $SiH_2[C(CH_3)]_2$ |
| General Name | Organo-Hydro Silane |
| Molecular Weight | |
| Appearance | Colorless liquid |
| Solubility in water | Insoluble |
| Autoignition temperature | °C. |
| Normal boiling point | °C. |
| Flash point | −°C. (closed cup) |
| Freezing point | < −°C. (at 1 atm.) |
| Density | 0. g/cm$^3$ (@ 20° C.) |
| Vapor density (air = 1) | >1 |
| Vapor pressure | Torr (@ 20° C.) |

The next and final element in the methods and composite membranes of the present invention is the low-pressure chemical vapor deposition (LPCVD) process by which those composite membranes are prepared. The preferred type of LPCVD process is one which uses opposing reactant geometry, sometimes referred to as a counterflow gas method. It has been found that this type of procedure is superior in achieving deposition of the microporous film within the pores of the mesoporous substrate, rather than simply on the surface walls of the substrate. A number of chemical vapor deposition (CVD) processes have been developed over the years for use in various industries. Among the most popular and widely practiced chemical vapor deposition techniques for depositing thin films on a substrate, are atmospheric pressure CVD (APCVD), low pressure CVD (LPCVD), and plasma enhanced CVD (PECVD). However, thin films deposited at atmospheric pressures are lacking in uniformity and step coverage, primarily as a result of the comparable rates for the homogeneous and heterogeneous reactions which take place during film deposition Plasma enhanced CVD uses radio frequency (rf)-induced glow discharges as the energy source for the deposition reactions, and thereby creates opportunities for the deposition to be carried out at lower operating temperatures. As a result, films deposited by this low temperature technique are generally uniform and have good adhesion, especially where high rf signals are used together with high gas flow rates. However, these films have poor conformal step coverage and pinhole counts can even be high. A further problem is that nitrogen and hydrogen often get incorporated into these films and stoichiometric compositions are difficult to achieve.

The composite membranes of the present invention are prepared using low pressure chemical vapor deposition (LPCVD) techniques, which allow flexible temperature operations in a low pressure regime. Chemical vapor deposition is essentially a material synthesis technique which involves the following sequential steps: (a) bulk diffusion and adsorption of the reactants, diluents and carrier gas onto the substrate; (b) diffusion, dissociation and chemical reaction on the surface of the substrate resulting in film formation; and (c) desorption from the substrate surface, and finally evacuation of gaseous by-products of the reaction from the reaction chamber by bulk transport. See, e.g., Fumeaux, Rigby and Davidson, Nature, 337 (6203), 147 (1989). The formation and subsequently the quality of the chemical vapor deposits is determined both by heterogeneous and homogeneous reactions, and by the extent that one is favored over the other. Heterogeneous reactions, which occur on or in close proximity to the substrate surface, are usually bimolecular in nature and follow the Langmuir-Hinshelwood mechanism. If the pressure of one reactant is kept constant and the pressure of the other reactant is varied, the deposition rate first increases, levels off, and then decreases. Homogeneous reactions, i.e., reactions occurring in the gas phase, may be detrimental, since they can generate large product clusters in the gas stream, which can then degrade the quality of the deposited film.

The kinetics of film growth in a chemical vapor deposition process is typically governed by either a surface reaction rate or the rate at which the reactants approach and impinge upon the substrate, depending upon action is the slowest. Adsorption and decomposition products on the substrate surface may be an additional factor which retards the rate of film growth. However, deposition kinetics which are sufficient to provide the desired end product can be achieved by the judicious adjustment of the chemical vapor deposition process variables. Growth of the deposited film at low temperatures generally tends to be surface reaction rate limited. See, e.g., Havredaki and Petropoulos, J. Membrane Sci., 12, 303 (1983).

It has been established that low pressure deposition principles lead to closer packing of the substrate, i.e., a higher throughput, while keeping the films uniform. See, e.g., Riedel and Spohr, J. Membrane Sci., 7, 225 (1980). At low operating temperatures the mean free path of the gas molecules increases with a concomitant decrease in the thickness of the boundary layer. Diffusive mass transfer rates are, therefore, greatly enhanced over surface reaction rates, thereby lowering the possibility of gas phase reactions. A variety of defect-free stoichiometric films of polysilicon, silicon nitride, silicon oxide, boron nitride, and tungsten having good uniformity and conformal step coverage have been synthesized using the horizontal tube hot wall LPCVD process. However, it is critical to success in terms of growth rate and film quality that the process variables be optimized. These variables are: (a) temperature—surface reaction rates are very sensitive to fluctuations in temperature, and follow Arrhenius behavior; radial heating with resistive coils is usually employed to maintain isothermal conditions between the substrate and the reactor wall throughout the process; (b) total pressure of the process—under conditions of constant temperature and reactant flow rates, the growth rate of the film follows a Langmuir-Hinshelwood mechanism; at higher pressures, the residence time of the reactants increases with an accompanying increase in the probability of gas phase reactions; and (c) partial pressures and flow rates of the reactants—deposition rates usually increase with increasing partial pressures of the reactants; increasing the deposition rates by increasing the partial pressures of the reactants, in turn increases the probability of undesired gas-phase reactions as the surface of the substrate becomes saturated.

A major disadvantage of the LPCVD process has been the low deposition rates which are achieved and the correspondingly poor yields. An increase in the process temperature should result in an exponential increase in the growth rate of the deposited film; but the resulting thermal stresses may prove to have a detrimental effect on the integrity of the deposited film. Thus, there have been numerous attempts to synthesize $SiO_2$ films using LPCVD at low, medium and high temperature ranges, and utilizing a variety of precursors. Such films synthesized at a low temperature range of 310°–450° C., however, have, shown high depletion, high etch rates, low refractive index (RI), and low density values. While temperatures in the high range of 700°–1000° C. have been reported to result in increased growth rates, they have also resulted in increased density. In the medium temperature range, films have been prepared using tetraethoxysilane (TEOS), $Si(OCH_2CH_3)_4$, which have excellent uniformity and step coverage, and in which the growth process follows Arrhenius behavior in the temperature range of 650°–800° C. See U.S. Pat. No. 4,902,307, infra. Dichlorosilane (DCS), $SiH_2Cl_2$, has been used as a reactant with $O_2$—$N_2$ in high temperature regimes to give films having good uniformity. See Gavalas et al., *Chem. Eng. Sci.*, infra.

A LPCVD reactor of the type which has been used to deposit silicon oxide, $SiO_2$, films on borosilicate glass wafers (discs) in accordance with the present invention, is schematically represented in FIG. 1. Reaction chamber 1 comprised a fused quartz reactor tube 3 having an inner diameter of 19.3 cm and a length of 155 cm, mounted horizontally within a five-zone Lindberg furnace 5. A fused silica boat 6 has slots 10 for holding the borosilicate glass wafers 12. A type K, nickel-aluminum vs nickel-chromium, thermocouple (not shown) was used to measure reaction chamber temperatures. The reactant delivery system consisted of a temperature controlled liquid diethylsilane (DES) source bottle 7 and a nitrous oxide tank 8. A carrier gas was not required for the DES, since it has a high vapor pressure of 200 Torr @ 25° C. Reactants were metered by Applied Materials Model AFC 550 automatic $N_2$ mass flow controllers 9 which were calibrated to regulate DES and $N_2O$ flows into reaction chamber 1. The total pressure in reaction chamber 1 was regulated by a feedback controlled throttle valve 11, and monitored by a MKS Baratron pressure gauge 13 and reaction chamber pressure readout device 14. The reactor apparatus was equipped with a pump assembly comprising an Edwards high vacuum pump 15 model E2M 80, supported by an Edwards mechanical booster pump 17 model EH 500.

Figure 2:
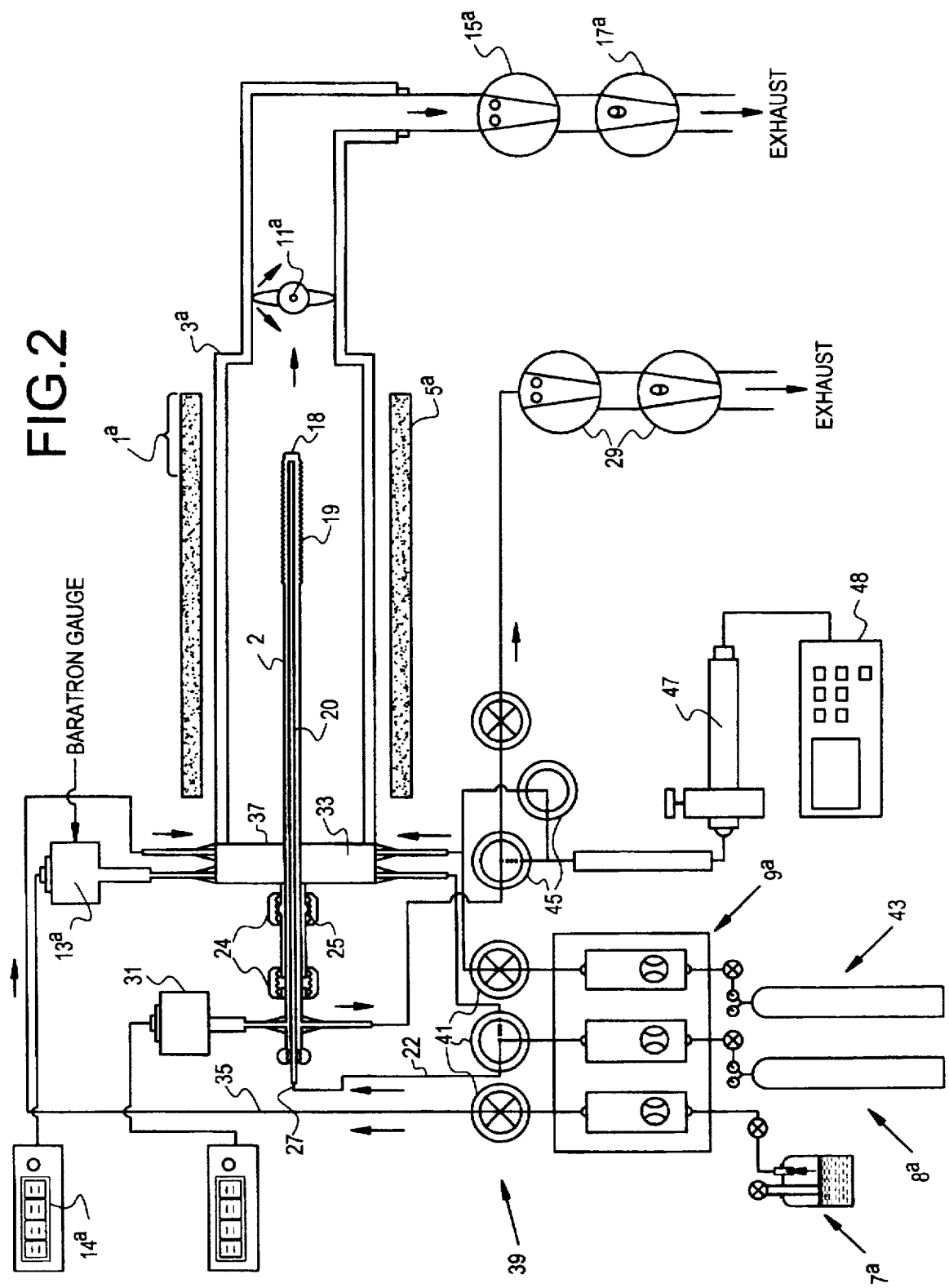
FIG. 2 is a schematic representation of a low pressure chemical vapor deposition (LPCVD) reactor apparatus of the type which has been used for deposition and testing, particularly with respect to deposits of silicon oxide, $SiO_2$, -carbide, and -nitride films on $Al_2O_3$ ceramic discs and Vycor® porous borosilicate glass tubings in accordance with the present invention.

Another LPCVD reactor of the type which has been used to deposit silicon oxide, $SiO_2$, films on borosilicate glass tubings in accordance with the present invention, is schematically represented in FIG. 2. Reaction chamber $1^a$ comprised a fused quartz reactor tube $3^a$ having an inner diameter of 19.3 cm and a length of 155 cm, mounted horizontally within a five-zone Lindberg furnace $5^a$. A type K, nickel-aluminum vs nickel-chromium, thermocouple (not shown) was used to measure reaction chamber temperatures. Within reaction chamber $1^a$ and fused quartz reactor tube $3^a$ was Vycor® borosilicate glass substrate tube 2 having three distinct segments on the tube 2: a blind end 18, an open non-porous section 20, and an unaffected porous part 19 between the other two segments. Non-porous segment 20 facilitated a leak-proof fit to the reaction chamber $1^a$ and nitrous oxide reactant delivery line 22. Unaffected porous part 19 comprised the active membrane area of borosilicate glass support 2. Borosilicate glass substrate 2 was held concentric to cylindrical fused quartz reaction tube $3^a$ by a series of cajon connectors 24 fitted onto non-porous end 20 of borosilicate glass support 2 projecting through orifice 25 of cylindrical fused quartz reaction tube $3^a$. Open end 27 of non-porous segment 20 was connected to gas delivery line 22 and a rotary-vane/booster pump assembly 29 by means of valves. A MKS Baratron pressure gauge 31 was employed to monitor changes in pressure inside borosilicate glass tube 2. The reactant delivery system consisted of a temperature controlled liquid diethylsilane (DES) source bottle $7^a$ and a nitrous oxide tank $8^a$. A carrier gas was not required for the DES, since it has a high vapor pressure of 200 Torr @ 25° C. Reactants were metered by Applied Materials Model AFC 550 automatic $N_2$ mass flow controllers $9^a$ which were calibrated to regulate DES and $O_2$ flows into reaction chamber $1^a$. The total pressure in reaction chamber $1^a$ was regulated by a feedback controlled throttle valve $11^a$, and monitored by a MKS Baratron pressure gauge $13^a$ and reaction chamber pressure readout device $14^a$. The reactor apparatus was equipped with a pump assembly comprising an Edwards high vacuum pump $15^a$ model E2M 80, supported by an Edwards mechanical booster pump $17^a$ model EH 500.

When the apparatus of FIG. 2 was used to carry out the opposing reactant geometry deposition procedure, a long, narrow stainless steel tube 33 was inserted inside borosilicate glass substrate tube 2, up to 2 cm from dosed end 18, to facilitate the flow of nitrous oxide. Feed end 35 was connected to nitrous oxide delivery line 22 and pump assembly 29. Fused quartz tube $3^a$ in reaction chamber $1^a$ was evacuated and sealed by closing chamber gate valve 37. DES was then fed into fused quartz tube $3^a$ in reaction chamber $1^a$ and after a desired pressure level was achieved, as monitored by chamber pressure readout means $14^a$. DES flow was switched off using on-off valve means 39. Nitrous oxide was then metered using mass flow controllers $9^a$ and a flow of nitrous oxide was continuously supplied to borosilicate glass tube substrate 2 by setting switching valve 41 to direct oxygen flow to stainless steel tube 33 inserted inside borosilicate glass substrate tube 2. Nitrous oxide flow was set until a steady pressure inside borosilicate glass tube substrate 2, as monitored by MKS Baratron pressure gauge 31, was obtained. This configuration created nitrous oxide and DES reactant streams at opposite sides of tubular borosilicate glass substrate 2. Nitrous oxide flow rates were adjusted by means of mass flow controllers $9^a$ to achieve a steady pressure of 4 Torr inside tubular borosilicate glass substrate 2, while DES vapor was pumped into fused quartz tube $3^a$ in reaction chamber $1^a$ concentric to tubular borosilicate glass substrate 2 and kept stagnant at a pressure of 8 Torr, as monitored by chamber pressure readout means $14^a$. After each period of deposition the nitrous oxide delivery was stopped. Gate valve 37 was then opened and fused quartz tube $3^a$ in reaction chamber $1^a$ was pumped down to vacuum by means of a pump assembly comprising an Edwards high vacuum pump $15^a$ model E2M 80, supported by an Edwards mechanical booster pump $17^a$ model EH 500, before testing for perm-selectivity. For example, after evacuating reaction chamber $1^a$, gate valve 37 was dosed and appropriate pressure differentials were established by introducing a given permeant, i.e., a permeating gas from source 43 into reaction chamber $1^a$. This pressure differential between reaction chamber $1^a$ outside and tubular borosilicate glass substrate 2 inside provided the driving force for flux across the composite membrane.

When the apparatus of FIG. 2 was used to evaluate the performance characteristics of the deposited film, the switching valves 41 were used to redirect the location, flow rates, and pressure of the DES or other silicon source, nitrous oxide or other nitrogen oxide gas, and the permeant gases. The switching valves 45 were then used to remove samples from the reaction chamber, which were then measured by means of quadrupole detector 47 and residual gas mass analyzer 48.

The LPCVD reactor illustrated in FIG. 2 has been used both to deposit predominantly silicon-oxide, with optionally minor amounts of silicon-carbide, and -nitride, films on ceramic $Al_2O_3$ discs and porous borosilicate glass tubings in accordance with the present invention, as well as to test the properties and characteristics of those deposits. Reaction chamber 1 comprises a fused quartz reactor tube 3 mounted horizontally within a five-zone Lindberg furnace 5. Within reaction chamber 1 and fused quartz reactor tube $3^a$ is either a porous ceramic $Al_2O_3$ disc (not shown), or a Vycor® borosilicate glass substrate tube 2 having three distinct segments on the tube 2: a blind end 18, an open non-porous section 20, and an unaffected porous part 19 between the other two segments. Non-porous segment 20 facilitates a leak-proof fit to the reaction chamber 1 and nitrous oxide delivery line 22. Unaffected porous part 19 comprises the active membrane area of borosilicate glass support 2. Borosilicate glass substrate 2 is held concentric to cylindrical fused quartz reaction tube $3^a$ by a series of cajon connectors 24 fitted onto non-porous end 20 of borosilicate glass support 2 projecting through orifice 25 of cylindrical fused quartz reaction tube $3^a$. It is also possible to use an alternate strategy in which borosilicate glass substrate 2 is held concentric to cylindrical fused quartz reaction tube $3^a$ by an epoxy plug (not shown) fitted around non-porous end 20, as well as epoxy coating (not shown) on borosilicate glass support 2 projecting through orifice 25 of cylindrical fused quartz reaction tube 3. The reactor apparatus is equipped with a pump assembly comprising an Edwards high vacuum pump 15 model E2M 80.

Commercial applications of the composite membranes of the present-invention will require designs which permit a significantly enhanced throughput. For example, a filtration module based on the composite membranes of the present invention might comprise a multiplicity of Vycor® tubings with silicon oxide microporous films deposited thereon, produced in accordance with the present invention, and arranged in parallel. Such a module will be about 0.2 to about 3 meters in length, preferably from about 0.5 to about 2 meters, more preferably from about 0.8, to about 1.2 meters in length, and most preferably about 1 meter in length. Such a module will be from about 0.05 to about 0.8 meter in diameter, preferably from about 0.1 to about 0.6 meter, and more preferably, from about 0.2 to about 0.4 meter in diameter. A significant advantage of the method of the resent invention is that it is capable of producing composite membranes and modules comprising such membranes, that have been specifically adapted to the requirement of a particular industry, or a commercial facility, or a specific environmental problem, in terms of the permeant gases present, the VOCs to be separated, and the ambient temperature and pressure conditions.

DESCRIPTION OF PREFERRED EMBODIMENTS

The examples below provide an initial exploration of the operating parameters of the method of the present invention, using DES and oxygen as the reactants. Some the deficiencies of the composite membranes produced in this way are also discussed. A performance comparison contrasting such composite membranes with those of the present invention produced by using nitrous oxide or other nitrogen oxide, is also set forth. Further examples demonstrate the preparation and performance characteristics of the composite membranes prepared using nitrous oxide. However, the descriptions below of preferred embodiments of the present invention, are presented by way of demonstrative examples which are intended to be illustrative only, and should not be taken as in any way limiting the scope of the present invention.

EXAMPLE 1

Silicon Oxide Film Deposition on Ceramic and Borosilicate Glass Wafers Using Diethylsilane (DES)

Boron doped single crystal <100> silicon wafers, polished on one side, and 10 cm in diameter, were mounted vertically on a fused silica boat with 12 single wafer slots and 10 double wafer slots. The distance of separation between the first and terminal virgin wafer was chosen to be 12.5 cm. The fused silica boat was placed with its front at 65 cm downstream in each experiment and all wafers were weighed accurately to 0.1 mg using a Mettler balance before and after film deposition. Oxygen and diethylsilane (DES) were delivered to the reaction chamber using a single side reactant geometry, by way of separate systems in order to avoid the possibility of any reaction occurring in the supply lines. Oxygen was first introduced into the reaction chamber, and as soon as a steady flow rate of oxygen was achieved, which took about 2 min, DES flow was commenced. The total pressure of the reaction chamber was then adjusted and maintained at the desired level by means of a feedback controlled throttle valve. Following deposition, the reaction chamber was cooled before downloading the coated wafers from the chamber.

Following the above procedures, the deposition rate was studied over a series of temperatures ranging from 375° to 500° C., with DES and oxygen flowmeters set to achieve a constant flow rate of 30 sccm and 15 sccm, respectively. Total pressure inside the reaction chamber was maintained at a constant level of 500±2 mTorr throughout the temperature series study. The pressure dependent behavior of deposition rate was evaluated between 100 and 500 mTorr, at 450° C., while keeping the flow rate constant at 15 sccm for oxygen and 30 sccm for DES. The oxygen flow rate dependent behavior of deposition rate was observed at constant conditions of temperature (450° C.), total pressure (500 mTorr), and flow rate of DES (30 sccm).

EXAMPLE 2

Film Characterization Techniques

Deposition rates were determined as oxide thickness (Å) over a deposition time (min) and then averaged over four virgin wafers used for each experiment. Film density was estimated from the fundamental mass volume relationship. Film thickness in Ångstroms was plotted against half of the total mass in milligrams deposited on both sides of the wafer. It was assumed that equal deposition occurred on both sides of the wafer substrate, and therefore, half-mass could be taken as the mass deposited on the polished side of the borosilicate glass wafer. Since the area of the wafer is constant, density can be estimated from the slope of such a plot, if it is linear. Thickness of the film deposited on one side was measured at five different points on the wafer using a Nanospec Interferometer. The index of refraction values were obtained by a Rudolph Research/AutoEL ellipsometer which consists of a polarizer and a compensator. Infrared spectroscopic analysis was done on a routine basis using a Perkin Elmer 1600 series FTIR spectrophotometer to determine the bonding characteristics of the deposits. An optical microscope, Reichert Wein (BTL 122815), was used to detect cracks, gas phase nucleation clusters, and other defects in the films. Stress was determined by employing a device developed for this purpose. The device measured any change in the radius of curvature of a wafer substrate resulting from film growth on one side. Two fixed and parallel He—Ne laser beams were placed so as to be incident on the wafer surface before and after deposition. The reflected beam in each case was then projected by an angled plane mirror as two points onto a scale where their separation could be accurately measured. The change in the separation distance was then fed into Stony's equation to obtain actual stress values.

EXAMPLE 3
Experimental Data on Deposition Rates—Temperature

The growth rate of the deposited silicon oxide film in Å per min increased from 21.5 Å/min to 43.4 Å/min over a temperature interval of 125° C. A sharp drop in the growth rate above 475° C. indicated a transition to the mass transfer limited regime and the onset of homogeneous gas phase reactions. The increasing number of homogeneous reactions decreased the amount of the reactants reaching the wafer surface; a conclusion which was corroborated by the abnormal decrease in density observed for deposits at 500° C. Particulate cluster formation at 500° C. was also visible under the optical microscope. Growth rates (Å/min) plotted-against 1000/T on a semi-log scale, showed excellent conformance to Arrhenius type behavior in the temperature range of 375° to 475° C. Film growth kinetics in this temperature range could therefore be assumed to follow a thermally activated heterogeneous mechanism characterized by the Arrhenius rate equation. The slope of the curve from this plotted data yielded an activation energy of 9 kcal/mol. Average film thickness showed minimal deviation from the linear least square fit as a function of half of the mass deposited on the wafers. This indicated that film density was not strongly dependent on temperature in the range of 375° to 475° C. Knowing that the area of the wafer was 78.5 $cm^2$, the density was calculated to be 2.14 $g/cm^3$. This density value was low compared to that of the thermally grown oxide (2.27 $g/cm^3$) and was attributed either to the composition of the films or to the presence of pin holes in the amorphous deposits which would tend to absorb moisture. Depletion was significantly lower at 450° C. than both 475° C. and 500° C., possibly because an increasing number of gas phase reactions at higher temperatures consumed the reactants before they could reach the surface of the downstream wafers. The stress in the wafers was found to be compressive at all temperatures, decreasing with increased deposition temperature. Index of refraction values evaluated using ellipsometry at a wavelength of 6328 Å were 1.449±0.002, a value which was lower than that for a thermal oxide (1.462), but in good agreement with the work done by Patterson et al. The refractive index of the films obtained remained relatively constant with changes in the deposition temperature. This behavior also seemed to conform with the low density of their deposits. Within the framework of the range of temperatures investigated, 450° C. appeared to be a suitable temperature that would yield good quality silicon oxide deposits at a moderate growth rate of 38.7 Å/min. Accordingly, further studies were carried out keeping the temperature invariant at 450° C.

Experimental Data on Deposition Rates—Pressure

Within the range of pressures investigated, the growth rate was found to increase monotonically; and this behavior could be attributed to the fact that more and more reactants were being adsorbed on the wafer surface as the pressure increased. With an increasing number of reaction sites on the wafer surface being occupied, the probability of reactions taking place on the substrate surface was enhanced, and as a consequence the deposition rate was higher. At 50 mTorr the growth rate was so small that measurable oxide thickness could not be achieved after a 30 min deposition effort. At approximately a total pressure of 500 mTorr the deposition rate appeared to plateau; and this result was in accord with earlier published studies. Decreased rates of deposition at relatively high pressures may be due to the onset of saturation of the substrate surface by reactants. Growth rate is proportional to the number of adsorbed molecules, and was found to exhibit a good least square fit when plotted against the square root of pressure. This square root pressure dependence could be due to the homolytic fission and subsequent adsorption of oxygen radicals on the silicon wafer surface: $O_2 \leftrightarrows 2O^{\circ}$. Density values decreased as the reaction chamber pressure was reduced from 500 mTorr to 100 mTorr, probably as a result of low adsorption on the wafer surface at the lower pressures. Uniformity in film thickness across the wafers were within 15% and the index of refraction was 1.449±0.002 regardless of the pressure condition involved. Stress values at all pressures were compressive in nature, but decreased with increasing pressure. Density and depletion effects pointed towards 500 mTorr as being the optimum pressure condition that would provide the optimum oxide plugs (pore size reducing film deposits) for the mesoporous borosilicate glass wafers.

Experimental Data on Deposition Rates—Oxygen Flow Rates

Deposition rates showed a linear dependence with the square root of oxygen flow. This behavior was expected since the increasing number of adsorbed oxygen molecules effectively leads to an enhanced surface area of the substrate, and therefore higher growth in a given time period. However, the growth rate started to level off above 30 sccm oxygen flow. This behavior could be attributed to surface saturation and insufficient pumping rates that failed to exhaust the reaction byproducts. Beyond 60 sccm, i.e., 90 sccm, ignition of the reactants in the gas phase occurred, creating copious amounts of $SiO_2$ particulates. No film growth was observed on the wafer surface, in good agreement with threshold effects, usually common under conditions of relatively high partial or total pressures. Transition into homogeneous gas phase reaction regime was evidenced by a drastic drop in density values with increasing oxygen flow rates. Increasing the flow rate of oxygen also resulted in severe downstream depletion effects. However, film density remained relatively constant with changes in the flow rate of oxygen. Stress values suffered a transition from the compressive to the tensile type after the flow rate of oxygen was increased to 30 sccm. All of the foregoing results argued strongly against employing oxygen flow rates higher than 15 sccm. The refractive index of the deposited films remained invariant over the oxygen flow rate range studied.

Assessment of the results set out above led to the conclusion that a temperature of 450° C., a pressure of 500 mTorr and a flow rate of oxygen and DES of 15 sccm and 30 sccm, respectively, would yield quality silicon oxide film deposits on a porous borosilicate glass wafer substrate at a moderate growth rate of 38.7 Å/min. Silicon oxide films deposited using these conditions would have an average density of 2.11 $g/cm^3$, a refractive index of 1.45, a compressive stress of 210 Mpa, and experience negligible depletion.

Using the procedures and materials described above, but substituting a borosilicate glass wafer for the ceramic wafer used therein, the results which are obtained will tend to more closely resemble those described in the following examples, where a borosilicate glass tubing is used as the membrane substrate, because of the difference in chemical makeup, and especially the difference in average pore diameter and porosity, between the ceramic substrate on the one hand, and the borosilicate glass substrate on the other. These differences have a more profound affect on the outcome than does the mere shape in which the membrane substrate happens to be fabricated.

EXAMPLE 4
Silicon Oxide Film Deposition on Borosilicate Glass Tubings Using Diethylsilane (DES)

Borosilicate glass, Vycor® #7930 from Corning Glass, Inc., and having a composition of 96% $SiO_2$ and 3% $B_2O_3$, was used for the preparation of the silicon oxide composite membranes herein described. The borosilicate glass substrate was of a tubular configuration open at both ends, with an outside diameter of 0.81 cm, an inside diameter of 0.57 cm, a porosity of 0.28, and a continuous pore structure of average diameter 40 Å. Preceding deposition, the borosilicate glass substrate was subjected, at both ends, to a well-controlled sintering treatment at 1200° C. This time-temperature treatment generated three distinct segments on the borosilicate glass tube: a blind end, an open non-porous section, and an unaffected porous part between the other two segments. The non-porous segment facilitated a leak-proof fit to the LPCVD reactor and the reactant delivery lines. The unaffected porous part comprised the active membrane area of the borosilicate glass support, the length of which was typically 15–20 cm. The borosilicate glass support was held concentric to the cylindrical quartz reaction chamber by a series of cajon connectors fitted onto the non-porous end of the tube projecting through the reaction chamber orifice. The open end of the non-porous segment was connected to gas delivery lines and a rotary-vane/booster pump assembly by means of valves. An MKS Baratron pressure gauge was employed to monitor changes in pressure inside the borosilicate glass tube. The borosilicate glass tube was inserted into the LPCVD reactor and evacuated. Meanwhile, the temperature was raised slowly at a rate of 60° C./hr, and then was held constant periodically after every hour, for 15 min, to ensure thermal equilibration. After an acceptable leak/outgassing rate of 4 mTorr/min was obtained, reactant flows were set and $SiO_2$ was deposited on the borosilicate glass substrate. Accordingly, the film deposition took place by means of so-called counterflow or opposing reactant geometries.

For the opposing geometry deposition procedure which was carried out, a long, narrow stainless steel tube was inserted inside the borosilicate glass substrate tube, up to 2 cm from the closed end, to facilitate the flow of oxygen. The feed end was connected to the oxygen delivery line and the pump assembly. The fused quartz tube reaction chamber was evacuated and sealed by closing the chamber gate valve. Diethylsilane (DES) was then fed into the chamber and after a desired pressure level was achieved, DES flow was switched off. Oxygen was then metered and a flow of oxygen was continuously supplied to the borosilicate glass tube substrate. Oxygen flow was set until a steady pressure inside the borosilicate glass tube substrate was obtained. This configuration created oxygen and DES streams at opposite side of the tubular borosilicate glass substrate. Oxygen flow rates were adjusted to achieve a steady pressure of 4 Torr inside the tubular borosilicate glass substrate, while DES vapor was pumped into the reaction chamber concentric to the membrane module and kept stagnant at a pressure of 8 Torr. After each period of deposition the oxygen delivery was stopped. The gate valve was then opened and the reaction chamber was pumped down to vacuum, before testing for perm-selectivity.

EXAMPLE 5
Membrane Characterization

The composite $SiO_2$ and borosilicate glass membrane prepared as described in Example 4, was characterized for permeability and selectivity by an in situ technique, which facilitated a rapid evaluation of membrane performance between those periods of time when the reaction chamber was being employed for film deposition. After evacuating the reaction chamber, the gate valve was closed and appropriate pressure differentials were established by introducing a given permeate gas into the reaction chamber. This pressure differential between the reaction chamber outside and the tubular borosilicate glass substrate inside provided the driving force for flux across the membrane. Gas flux across the membrane was estimated by monitoring the increase in pressure inside the tubular borosilicate glass membrane at specific time intervals. The rate of pressure rise, dP/dt (Torr/min), was then plotted against the appropriate pressure differential across the membrane Del P (Torr). From the slope of such a plot, the permeability coefficient ($min^{-1}$) for the specific permeate was estimated. Selectivity was assessed by calculating the ratio of the permeability coefficients. The permeant gases were delivered under the same conditions of temperature and using the same feed lines.

The permeabilities of hydrogen, helium, and nitrogen were measured in the temperature range of 25°–475° C. Additional permeability measurements were made for toluene and acetone in the temperature range of 25°–300° C. An Arrhenius plot was generated by plotting ln(permeability coefficient) versus 1000/temperature. Using the same apparatus setup as that which was used for the permeability measurements, water vapor was passed inside the chamber creating 500 mTorr pressure. The experiment was run at 450° C. for a total of 60 hours. The permeabilities of hydrogen, helium, and nitrogen gasses were measured at specific intervals between deposition runs in order to monitor any variation in their permeabilities which would be indicative of changes in the properties of the membrane being created by the deposition runs. A set of studies was also carried out on binary gas mixtures. This set of experiments was carried out after a membrane was evaluated for pure gas permeability, and after the temperature runs, and water stability tests were completed. The He/Ar and He/$N_2$ binary gas mixture tests were done at 300° C. The apparatus setup which was used was the same as that used for gas permeability measurements, and a similar technique was used to compute the permeability coefficient. In order to facilitate determination of the composition of the gases in the reaction chamber (feed side) and in the tubular borosilicate glass substrate (permeant side), an INFICON Quadrex 200 Residual Gas (quadrupole) Mass Analyzer was interfaced with the LPCVD system. This system gave an output signal which was proportional to the composition of the sampled air. The desired gas mixture compositions (1:1, 1:4, and 1:8) were obtained by introducing the appropriate gas pressures. For example, to make a 1:1 He/Ar mixture having a 20 Torr He and 20 Torr Ar composition, 20 Torr He was first introduced into the reaction chamber, then 20 Torr of Ar followed to attain a total of 40 Torr pressure inside the reaction chamber. Air samples from the reaction chamber and the tubular borosilicate glass substrate were taken before and after permeability measurements, respectively. The composition of the permeant gas was evaluated from the known composition of the feed gas and the mass analyzer response. The partial pressures of each gas in the permeant side were then calculated from the total pressure readings for the tubular borosilicate glass substrate side, after estimating its composition.

EXAMPLE 6
Experimental Results

Permeability measurements after 3 hours of deposition indicated similar behavior to that observed for the same side reaction geometry described above in Example 1. The slope of the Knudsen curve was plotted as a function of the kinetic diameter of the permeant gases, and that Knudsen diffusion is independent of molecular size is clearly evident from such a plot for the tubular borosilicate glass substrate. After 3 hours of $SiO_2$ deposition, however, the onset of size effects on flux across the membrane was evident between He, $H_2$, and $N_2$, Ar, and toluene, and was indicative of selectivity values higher than those predicted by Knudsen. However, beyond-Knudsen selectivity was not observed between $N_2$, Ar and toluene. Initiation of size selectivity also implied transition from the mesoporous structure present in the virgin borosilicate glass substrate before deposition, to a mesoporous structure which probably resulted from a pore filling effect.

Permeability coefficients of the set of permeants were plotted as a function of deposition time on a semilog scale, and contrary to previous observations with the same side reaction geometry process, no signs of cracking of the membrane were observed even after long periods of deposition. This was evidenced by the monotonic decrease of flux across the membrane with deposition time for all permeant gases. This behavior strongly indicated that a shift of reaction site from the surface of the borosilicate glass substrate to the insides of the pore channels of the substrate had taken place, thereby demonstrating the efficacy of the opposing reaction geometry. Further, the time evolution plot of the pore-plugging process revealed two important observations. (a) After approximately 8 hours of deposition time a cross-over point was seen when $H_2$ permeability decreased below He. He and $H_2$ showed activated diffusion mechanisms and their permeation characteristics seemed to be strongly influenced by wall effects. This behavior strongly pointed to a transition from the mesoporous borosilicate glass into a mesoporous structure where diffusing molecules migrated against the potential barrier exerted by the micropore walls. Under such circumstances, simpler and monoatomic molecules such as He would diffuse much more easily, compared to the other permeant gases, as evidenced by the smaller decrease in its permeability coefficient values with deposition time. (b) A lack of size selectivity between $N_2$ and toluene until about 34 hours of deposition was observed; but there was a failure to observe, contrary to indications in the literature, a sharp drop in $N_2$ permeability around the $H_2$—He crossover point. Noting that the $SiO_2$/borosilicate glass membranes in said literature were prepared by annealing following deposition, which led to densification of the deposits, it was concluded that there was no drastic decrease in $N_2$ permeability due to the presence of pin-holes in the $SiO_2$ plugs deposited by the method of the present invention, which allowed Knudsen diffusion of $N_2$, Ar, and toluene. The presence of such pin-holes could have been due, on the other hand, to a combination of low density of the deposits and depletion effects.

After about 26 hours of deposition, the diffusion of toluene was observed to deviate from Knudsen diffusion. However, selectivity between nitrogen and toluene were achieved at very low permeability coefficient values, consistent with the conclusion that the pin-holes in the silicon oxide deposits had led to further undesired clogging of pores already selective to $N_2$ permeation. The selectivity values were calculated as ratios of permeability coefficients were plotted as a function of deposition time. After 40 hours of deposition the selectivity values were He/$N_2$=169, He/toluene=613, $H_2$/$N_2$=59, $H_2$/toluene=214, and $N_2$/toluene=3.63. However, the growth rates of the deposits were very slow as a result of the stagnant condition maintained inside the reaction chamber, which in turn affected the equilibrium reaction rates unfavorably. Since reaction by-products were not exhausted, they were also instrumental in producing porous silicon oxide deposits. Nevertheless, slow growth rates were ideal for studying trends in permselectivity variation. For example, there was evidence of $N_2$/toluene selectivity beyond that attributable to Knudsen diffusion. Stability of the composite membranes was also evaluated by exposing them to $H_2O$ at 450° C. for a period of 60 hours, which revealed no significant change in the permeabilities of $H_2$, He and $N_2$, indicating an excellent degree of stability.

Permeability experiments with He/Ar and He/$N_2$ mixtures revealed that the total permeability coefficient decreased with increasing amounts of Ar or $N_2$. This result was expected since both Ar and $N_2$ have lower permeability than He, probably due to their larger size and higher mass values. For the He/Ar mixtures, the corresponding computed permeability coefficient for He did not deviate significantly from the calculated value for pure He permeability. This demonstrated that the presence of Ar did not affect the permeation of He to any important extent. However, the same trend was not observed for the He/$N_2$ mixture, for which the corresponding He permeability decreased with increasing $N_2$/He ratio. It was surmised that this observation was due to the superior ability of $N_2$ molecules to become adsorbed on the pore surface, compared to the ability of Ar molecules be become thus adsorbed. Consequently, it was concluded that $N_2$ molecules exhibit a greater pore blocking capability and therefore a greater ability to reduce He permeability, than Ar molecules in He/Ar and He/$N_2$ gas mixtures.

EXAMPLE 7
Silicon Oxide, -Carbide, and -Nitride Film Deposition on Ceramic Discs And Borosilicate Glass Tubings Using Ditertiarybutylsilane (DTBS)

Two types of membrane substrate were employed for the permeability and selectivity studies. The first was a flat ceramic disc commercially available from Coors Ceramics as a 5/32" thick aluminum oxide ($Al_2O_3$) material with an average pore diameter of 0.5µ and a porosity of 0.196. The second was a borosilicate glass tubing commercially available from Corning Glass, Inc. as Vycor®, with a 0.8 cm outside diameter, an average pore diameter of 40 Å, and a porosity of 0.28. For the flat ceramic discs, estimates of average pore diameter and porosity were calculated from the results of three investigative techniques: (1) an unsteady state measurement, carried out as described, e.g., in Yasuda and Tsai, *J. Appl. Poly. Sci.*, 18, 805 (1974); (2) a steady state $N_2$ permeation measurement; and (3) a steady state VOC-$N_2$ separation measurement. In the unsteady state technique, pure $N_2$ gas from a reservoir is placed on the feed side of the membrane. Permeation of $N_2$ to the other side leads to a drop in $N_2$ pressure in the reservoir with time, from which one can estimate the effective pore size of the membrane. In the steady state $N_2$ permeation technique, pure $N_2$ flows on the feed side of the membrane. The flow rate of the $N_2$ permeating through the membrane is measured with a bubble flow meter. Using standard equations, it is possible to calculate the average pore size of the membrane from the rate of $N_2$ permeation at a given applied pressure difference. In the steady state VOC-$N_2$ separation technique, a $N_2$ stream containing a known amount of a volatile organic compound (VOC), is passed with a small gauge pressure on the feed side of the ceramic disc module. The permeated gas on the other side of the ceramic disc module is injected into a gas chromatograph (GC) in order to establish the VOC concentration in the permeated stream. The operational efficiency of the micropore structure of the membrane being studied is established through permeation studies of pure gases and gas mixtures, such as $N_2$/acetone, $N_2$/carbon tetrachloride, $N_2$/methylene chloride, and $N_2$/toluene.

The borosilicate glass Vycor® tubings were used to reach the target average pore size of 4–7 Å more efficiently that with the ceramic discs, as well as to allow in situ testing in the low pressure chemical vapor deposition (LPCVD) reaction chamber after deposition. Ditertiarybutylsilane (DTBS) was used as the reactant gas to form SiC and in the presence of $NH_3$ or $O_2$ to form $Si_3N_4$ or $SiO_2$, respectively. In the case of SiC, the growth rates were determined as a function of processing parameters for DTBS flow rates in the range of 5 to 60 sccm, pressures in the range of 0.05 to 0.3 Torr, and temperatures in the range of 600° to 850° C. At a constant temperature of 650° C., the growth rate was observed to vary linearly with the square root of flow rate and pressure. This behavior was considered to be consistent with a Langmuir-Hinshelwood reaction mechanism requiring two adjacent adsorption sites due to the bulkiness of the t-butyl groups in the DTBS.

For a constant flow rate of 30 sccm and a pressure of 0.2 Torr, the growth rate dependence on temperature was seen to follow Arrhenius behavior in the range of 600°–675° C. that yielded an activation energy of 24 kcal/mol. This behavior was considered to be consistent with the existence of a single rate limiting step controlling the deposition process. At temperatures above 675° C., the deposition rate was observed to decrease, reflecting a combination of factors, including the onset of mass transfer limitations and the adsorption of decomposition products, which were considered to act as a retardant to the deposition film growth process. In the range between 625° to 750° C., there was a rapid increase in the carbon content, from the stoichiometric value to 75% at 850° C. From this and other information, it was concluded that the primary decomposition pathway for DTBS involved silylene formation either by elimination of $H_2$ or $C_4H_{10}$. The availability of this additional carbon source enhances adsorption on the pore surfaces of the membrane substrate, thus causing the observed increase in the carbon content with the application of higher temperatures.

At 800° C., $NH_3$ was added to produce $Si_3N_4$ film deposition. Although little change was observed in the concentration of Si in the deposited film, there was a substantial increase in the nitrogen content of the film with higher amounts of $NH_3$, which took place at the expense of the carbon content. Thus, by variation in the $NH_3$ flow rate only, it was found to be possible to produce films with compositions from pure silicon carbide to pure silicon nitride.

EXAMPLE 8
Deposited Film Characteristics

The density of the deposited SiC films was determined by plotting the film thickness against the weight gain due to deposition. From the slope of the observed linear dependence, the density was calculated to be equal to 2.0 g/cm³, which was lower than the reported value of 3.2 g/cm³ for bulk SiC. It was concluded that the difference could be attributed to the amorphous, and thus less dense, nature of the SiC deposits. The addition of $NH_3$ to the reaction chamber resulted in films of higher density, which reflected the gradual displacement of the carbide component of the deposited film composition by the denser nitride component. The x-ray diffraction patterns indicated that all deposited films were amorphous in structure for deposition temperatures of 850° C. and below. The hardness and Young's modulus of the deposited films were observed to increase as the deposition temperature was raised up to 750° C. This increase was found to parallel the increase in carbon content in the deposited film. Near stoichiometry (750° C.), the values for hardness and Young's modulus were 20 and 200 GPa, respectively, which are within a factor of 5 of the values for the diamond used for the indenting process, clearly demonstrating the superior strength properties of these amorphous ceramic films. Carbide and nitride deposits on $Al_2O_3$ were compressive and revealed no signs of cracking. Chemical etching experiments showed the carbide and nitride deposits to be immune to highly acidic (49% HF at 25° C.) and basic (KOH at 80° C.) solutions.

EXAMPLE 9
Varied Process Parameters and Results—$SiO_2$ Deposits

Varied temperature—for $SiO_2$ deposits, the process variables investigated were temperature, pressure, $O_2$ flow rate, and $O_2$/DES ratio. The growth rate of the oxide film was determined as a function of temperature between 375° and 450° C., while maintaining a constant pressure of 0.5 Torr, a reactant gas flow rate of 50 sccm, and an $O_2$/DES ratio of 2/1. A semilog plot of average growth rate versus $T^{-1}$ indicated Arrhenius behavior, yielding an apparent activation energy of 10 kcal/mol. This relatively low value was found to imply a rate mechanism controlled by gas phase diffusion. Constant temperature—for constant conditions of temperature (400° C.), reactant gas flow rate (50 sccm), and $O_2$/DES ratio (2/1), the oxide growth rate was observed to decrease monotonically with lower pressures in the range from 0.75 Torr down to 0.35 Torr, where deposition was observed to cease abruptly. Varied $O_2$ flow—for constant conditions of temperature (400° C.), reactant gas flow rate (50 sccm), and pressure (0.5 Torr), the oxide growth rate was observed to exhibit a linear dependence over the $O_2$ flow rate range of 25 to 117 sccm, which indicated that the reaction rate was controlled by $O_2$ diffusion to the surface. At $O_2$ flow rates higher than 117 sccm, this linear dependence was followed by an abrupt cessation in deposition. In both the pressure and flow rate studies in which film deposition ceased, the residence time of the reactant gases within the reaction chamber was so short (<2 sec) that insufficient heat was transferred to raise the temperature of those reactant gases to a point where deposition could occur. At the higher deposition temperature of 450° C., this effect was no longer observed. Refractive index and density—the refractive index data, obtained by standard ellipsometry at the wavelength of 632.8 nm, revealed values in the narrow range of 1.453 to 1.453, independent of all deposition conditions and close to the value of 1.459 for thermally grown oxide. The density of the deposited films was calculated to be 2.25 g/cm³, which is close to the value of 2.27 g/cm³ for thermally grown oxide. Etch rates—the etch rates of the oxide films in a P-etch solution comprising 15 parts hydrofluoric acid (49%), 10 parts nitric acid (70%), and 300 parts water, were determined by measuring the change in film thickness as a function of etch time. The etch rate decreased slightly with higher deposition temperature, reflecting the gradual removal of the HSi-O$_3$ moiety, whose presence had been detected by IR spectroscopy, and the associated reduction in the breakup of the network forming structure. However, the substantial decrease in etch rate observed with higher annealing temperature, was attributed to the removal of the water and hydroxyl group, which in turn resulted in structural changes to the material. These results were confirmed by IR spectroscopy, where shifts to higher wave numbers for the remaining peaks was thought to result from a decrease in the Si—O—Si bond angle and the Si—Si distance. At a constant deposition temperature, the etch rate measurements were found to be independent of pressure and flow rate variations. Permeability and selectivity measurements—conducted on membrane structures consisting of porous Al$_2$O$_3$ discs and SiC films deposited under two different processing conditions: (1) 835° C., 10 sccm DTBS, and 100 mTorr resulting in 43.7 mg film; and (2) 850° C., 30 sccm DTBS, and 200 mTorr, resulting in 103.5 mg film, indicated in both cases total blockage of pores. While it as feasible to achieve proper pore size by modifying the time of deposition, it was considered more desirable to start with initially smaller pore sizes and set up in situ testing procedures in order to achieve the goal of a composite membrane with selectivity based on a pore diameter of 4–7 Å. Consequently, permeability studies were initiated on Vycor® porous borosilicate glass tubing before and after SiO$_2$ deposition. The observations from these studies demonstrated that permeability through the membrane structure decreases as a ~250 nm film is deposited on the inner and outer surfaces of the tubing. This decrease is indicative of the pore filling effect caused by the deposit, as well as of a suspected non-uniform pore size distribution in the Vycor® substrate, for which methods of testing pore size distribution are essential. Another observation demonstrated that gas separation, as indicated by the observed linear dependence on the inverse square root of molecular weight, was being controlled by Knudsen diffusion, a behavior which is expected for pore dimensions above 10 Å. Consequently, further increases in the amount of oxide deposited on the porous borosilicate glass tubing should result in the desired pore size and higher selectivity.

EXAMPLE 10
Contrasted Properties of Composite Membranes Prepared Using O$_2$ and N$_2$O Composite membranes were made using the techniques and apparatus described in the examples further above, with the variations in conditions set out in the table below:

TABLE 3

| Membrane No. | Deposition Conditions | Geometry |
|---|---|---|
| I | 8 Torr DES stagnant; 4 Torr O$_2$ at 15 sccm | DES in chamber; O$_2$ in Vycor® tube |
| II | 4 Torr DES at 30 sccm; 2 Torr O$_2$ at 125 sccm | DES in Vycor® tube; O$_2$ in chamber |
| III | 1 Torr DES at 30 sccm; 4 Torr O$_2$ at 15 sccm | DES in chamber; O$_2$ in Vycor® tube |
| IV | 1 Torr DES at 30 sccm; 6.6 Torr O$_2$ at 30 sccm | DES in chamber; O$_2$ in Vycor® tube |
| V | 1 Torr DES at 30 sccm; >10 Torr O$_2$ at 120 sccm | DES in chamber; O$_2$ in Vycor® tube |
| VI | 4 Torr DES at 30 sccm; 3.3 Torr N$_2$O at 125 sccm | DES in Vycor® tube; N$_2$O in chamber |
| VII | 4 Torr DES at 30 sccm; 4.4 Torr N$_2$O at 200 sccm | DES in Vycor® tube; N$_2$O in chamber |

Faster growth conditions were achieved by continuously flowing the reactant gases rather than using stagnant conditions. The contrasting properties of the various composite membranes prepared in this way is illustrated by the graph FIG. 3 which shows the drop in toluene permeability with deposition time for the composite membranes prepared under the conditions specified in the table above. Curves with steeper slopes reflect conditions which favor higher pore clogging rates. The results also illustrate the dramatic enhancement in N$_2$/VOC selectivities achieved by replacing the oxygen precursor used for producing the SiO$_2$ film with N$_2$O, which has a larger kinetic diameter. These N$_2$/VOC selectivities ranged from the low Knudsen values of about 2/1 up to values on the order of 50/1.

Membranes III, IV and V were prepared to investigate the effect of varying the O$_2$ flow rate on the pore narrowing rate. In all three cases, DES was allowed to flow on the outer surface of each membrane while O$_2$ was allowed to flow on the inner surface to minimize powder formation. The rate of drop in permeability for all test gases was observed to increase with higher oxygen flow rate, which indicated in turn a faster SiO$_2$ film growth and an enhanced pore narrowing rate. Comparative values of selectivity for these three membranes also showed an increase with higher O$_2$ flow rate. After a 9 hr deposition time, the permeability ratio in the case of He:C$_7$H$_8$ was found to be equal to 13, 49 and 59 for membranes III, IV and V where the O$_2$ flow rate was 15, 30, and 120 sccm, respectively.

A comparison of permselectivity results between membranes II and V can be made. These membranes were fabricated in a similar manner, except that for membrane II the DES was allowed to flow on the inner surface of the Vycor® tube, while for membrane V, DES was allowed to flow on the outer surface of the tube. The results obtained indicate that the pore narrowing rate was significantly higher for membrane II due to the higher resistance to the DES flow within the small inner volume of the membrane as compared to the large outer volume. This is reflected in the higher steady state pressure within membrane II (4 Torr) as compared to that outside membrane V (1 Torr) for the same DES flow rate of 30 sccm.

Figure 4:
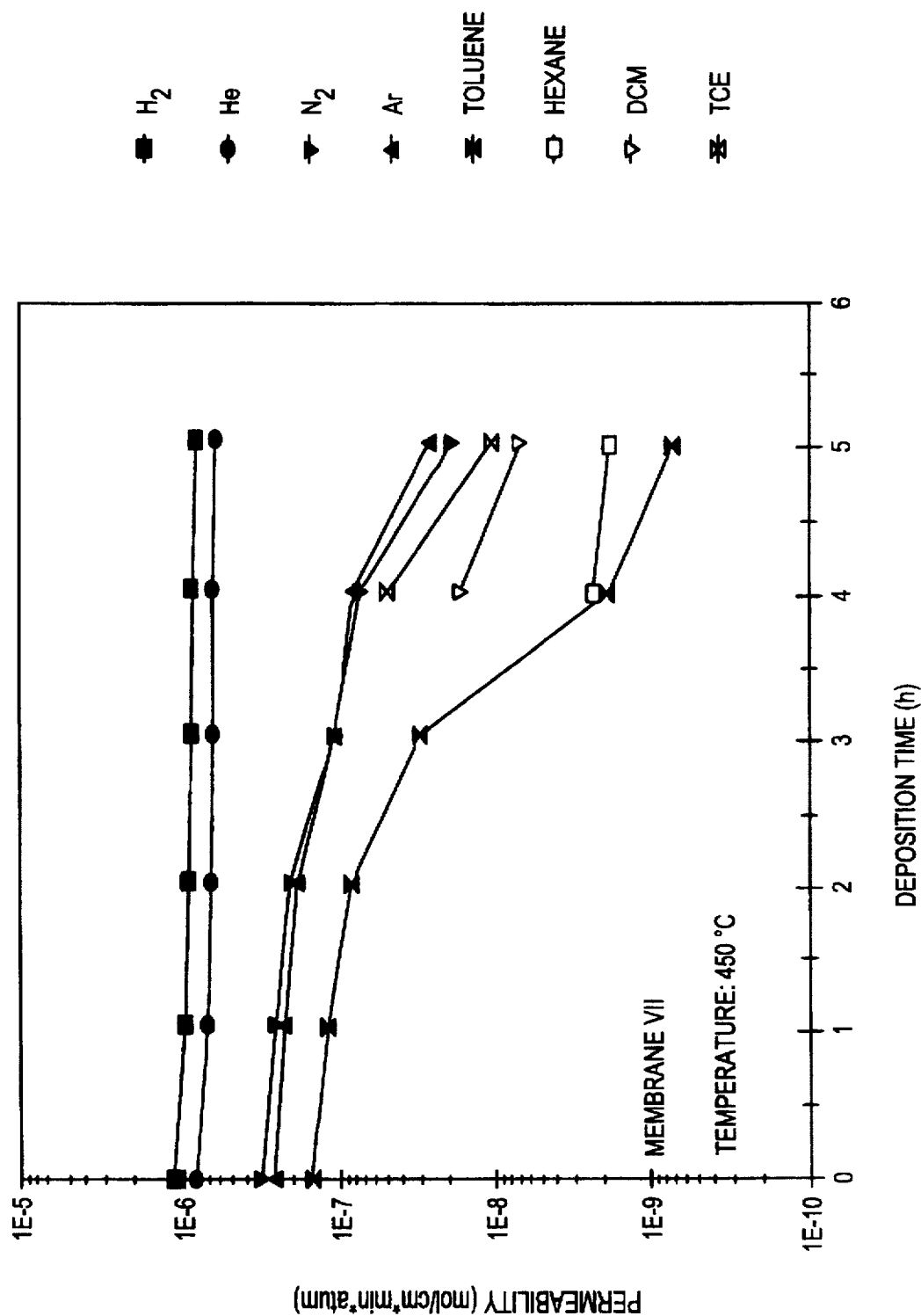
FIG. 4 is a graph showing the permeability coefficients of test permeants as a function of deposition time for composite membrane VII.

The very high selectivities were achieved with a minimal loss in permeability for hydrogen, helium, and nitrogen relative to the larger sized VOC molecules, as is illustrated by the graph in FIG. 4. After a deposition period of about 5 hours, the selectivity values for H$_2$, He, and N$_2$ relative to toluene were determined to be close to 1000/1, 900/1, and 100/1, respectively, while the permeability of these gases dropped by factors of 1.2, 1.3, and 4, respectively, when compared to the permeability across the uncoated Vycor® tubing, as is illustrated by the graph in FIG. 5.

Mass spectrometric measurements with single VOC permeants (toluene, dichloromethane, and trichloroethylene) failed to show their presence on the permeate side of the composite membrane. The same type of measurements made with gas mixtures revealed that there was no difference in permselectivity behavior between the gas mixtures and the pure permeant gases. Experiments conducted with 1/1 N$_2$/toluene mixtures showed the expected N$_2$ peak (mn/e= 28), but none of the toluene peaks (m/e=91 and m/e–92) at a total pressure drop of 30 Torr. These results indicated that, within the sensitivity limits of the mass spectrometer used, high N$_2$/VOC selectivities were achievable with the composite membranes of the present invention. Long term stability studies of 60 hrs at 450° C. carried out on these composite membrane structures in a H$_2$O environment failed to show any significant changes in permselectivity. No cracking or other gross deficiencies or mechanical instabilities were observed during or after repeated thermal cycling of the composite membranes between room temperature and elevated temperatures of 450° C. This test data is indicative of the good thermal, chemical and mechanical reliability of the composite membranes of the present invention.

EXAMPLE 11
Selectivities of Membranes I–VII

The selectivity values obtained after 5 hours of deposition for membranes I–VII are set out in Table 4 further below. It is evident from those values that membrane II yields the best permselectivity results among those fabricated using DES and $O_2$. It is evident from FIG. 3, which is a graphical representation of the dependence of $C_7H_8$ permeability on deposition time, that curves with steeper slopes reflect processing conditions favoring higher pore narrowing rates.

TABLE 4

| SELECTIV- | MEMBRANE NO. | | | | | | |
|---|---|---|---|---|---|---|---|
| ITY | I | II | III | IV | V | VI | VII |
| $H_2:N_2$ | 6.8 | 31 | 4.8 | 9 | 10.7 | 268 | 43 |
| $H_2:C_7H_8$ | 12 | 70.8 | 9.5 | 19 | 24.6 | 671 | 1148 |
| $He:N_2$ | 6.3 | 25 | 4.1 | 10 | 13.2 | 241 | 33 |
| $He:C_7H_8$ | 11 | 57 | 8.2 | 21 | 30.4 | 605 | 876 |
| $N_2:C_7H_8$ | 1.8 | 2.2 | 2 | 2.1 | 2.3 | 2.5 | >40 |
| $N_2:C_6H_{14}$ | | | | | | | >30 |
| $N_2:CH_2Cl_2$ | | | | | | | <4 |
| $N_2:C_2HCl_3$ | | | | | | | >1.5 |

The values in the table above indicate that high selectivities for $H_2$ and He, relative to $H_2$, Ar and $C_7H_8$ can be readily achieved due to the large size differences between those groups of molecules, and this may be of practical importance in a number of applications. However, the present invention is especially concerned with the separation of VOCs such as toluene, n-hexane ($C_6H_{14}$), dichloromethane ($CH_2Cl_2$), trichloroethylene ($C_2HCl_3$) from inert, permeant gases such as helium (He), nitrogen ($N_2$) and argon (Ar), which is of considerable importance to the pharmaceutical and specialty chemicals industries. For membrane II, the highest $N_2:C_7H_8$ selectivity attained was around 10, which is better than that reported using organic polymers, but the permeability for $N_2$ was lower than optimum. Good separation between species of comparable size while retaining relatively high permeability for $N_2$ requires a membrane with a narrow pore size range with a final pore diameter that is larger than the $N_2$ kinetic diameter (3.74 Å), but smaller than that of $C_7H_8$ (5.92 Å).

Figure 3:
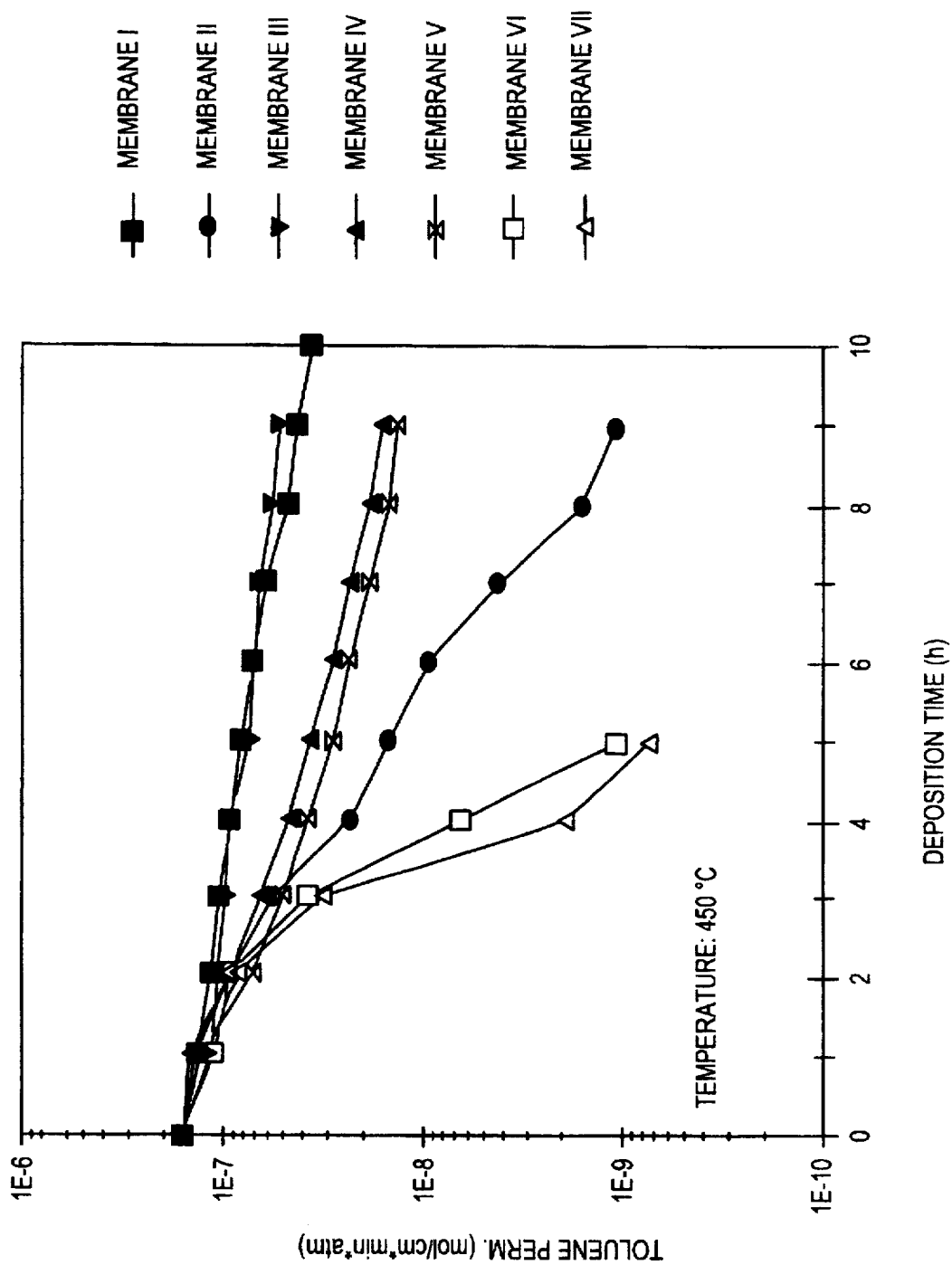
FIG. 3 is a graph showing the dependence of the permeability coefficient of toluene on deposition time for composite membranes prepared under various conditions.

Membranes prepared using $N_2O$ as an oxidant demonstrated better permselectivity results compared to those prepared with $O_2$. FIG. 3 illustrates the steep slopes associated with membranes VI and VII, which reflect the enhanced pore narrowing rate for this process. For both membranes, the permeabilities of $H_2$ and He remained with the higher deposition times, showing no more than a factor of 1.5 drop relative to the untreated Vycor® permeability values. For membrane VI the selectivities obtained within a 5 hour deposition period using 125 sccm of $N_2O$ were: $H_2:N_2$=268; $H_2:C_7H_8$=671; $He:N_2$=241; $He:C_7H_8$=605; and $N_2:C_7H_8$=2.5. The high selectivities achieved for $H_2$ and He indicate that the pores of the membrane are small enough to preferentially hamper the diffusion of the larger molecules, while the minor gain in $N_2:C_7H_8$ selectivity compared to the other membranes is probably due to the presence of a broad-pore size distribution in membrane VI caused by nonuniform film deposition.

In order to achieve further improvements in both pore narrowing rate and $SiO_2$ film uniformity, membrane VII was fabricated with a higher $N_2O$ flow rate of 200 sccm. FIG. 4 graphically illustrates the variation in test gas permeabilities as a function of deposition time for membrane VII. The permeabilities of $H_2$ and He appear to exhibit an insignificant drop over a 4 hour deposition period with respect to the untreated Vycor® permeability (~1.1), while the permeability for $N_2$ dropped by a factor of 4. The selectivity values obtained for membrane VII by the end of the deposition period were: $H_2:N_2$=12; $H_2:C_7H_8$=467; $He:N_2$=9; $He:C_7H_8$=348; $Ar:C_7H_8$=44; and $N_2:C_7H_8$=39. As a result of the small drop in $N_2$ permeability, the $H_2:N_2$ and $He:N_2$ selectivity values were not very high, but the $N_2:C_7H_8$ and $Ar:C_7H_8$ selectivity values which were obtained were very surprisingly high, be 20 times predicted Knudsen selectivity. These selectivity values establish that by using the self-limiting oxidant film deposition concept of the present invention, it is possible to achieve the production of nanoscale and subnanoscale structures capable of separating molecules with small differences in effective molecular size.

Figure 5:
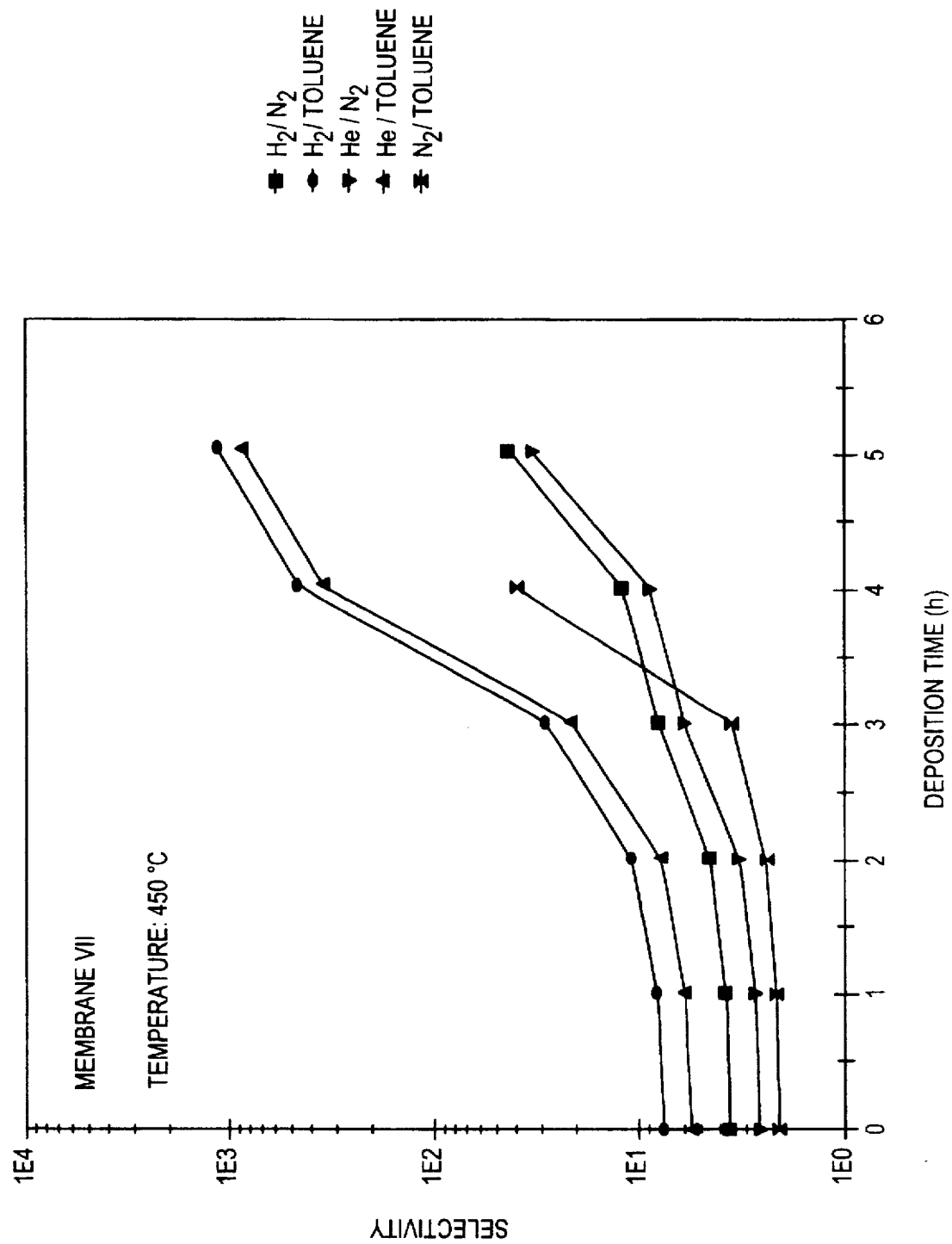
FIG. 5 is a graph showing the selectivity of composite membrane VII for different test permeants.
Figure 6:
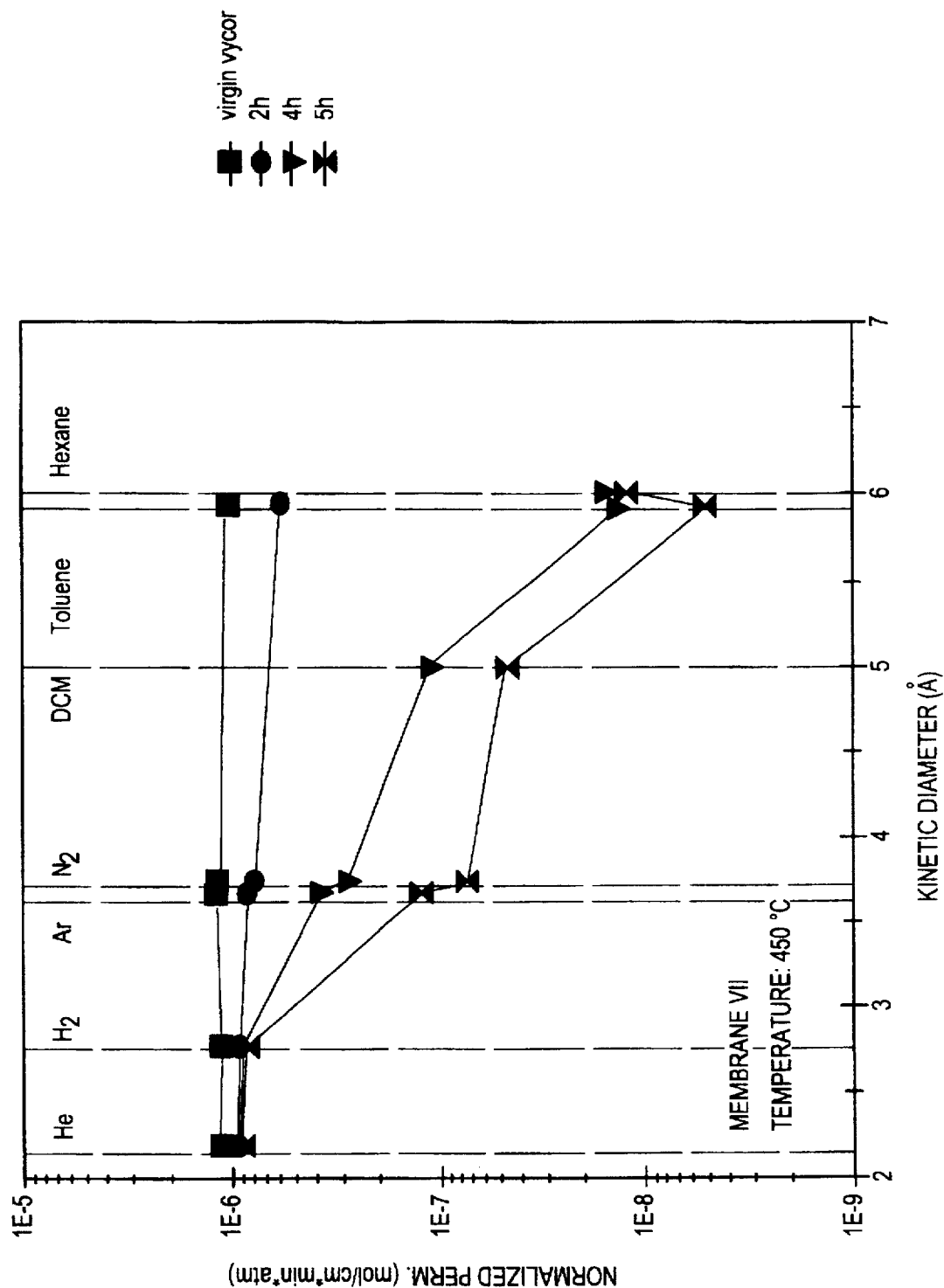
FIG. 6 is a graph showing normalized permeability as a function of kinetic diameter of permeant gases at different periods of deposition for membrane VII.

FIG. 5 reveals that a switch in the Ar and $N_2$ permeabilities has occurred after 3 hours of film deposition, which is the same point in time at which the $C_7H_8$ permeability started to drop significantly. This observation suggests that membrane VII has a narrow pore size distribution (~4–6 Å) that is able to discriminate between the size of $C_7H_8$ (5.92 Å), $N_2$ (3.74 Å) and Ar (3.67 Å). FIG. 6 illustrates the permeability of various test gases at different deposition times, multiplied by the square root of the $H_2$: permeant gas molecular weight ratio, as a function of kinetic diameter. It is evident from this data that the more substantial drops in permeability occur for the larger molecules as a result of the progressive pore narrowing associated with the higher deposition time.

In order to investigate whether or not adsorption was a contributing factor in the results obtained, the permeability measurements were extended from the standard testing period of 3 minutes up to 30 minutes for $N_2$, Ar, and $C_7H_8$. Additional measurements were also made for $C_6H_{14}$, $CH_2Cl_2$ and $C_2HCl_3$. Consistent results showing $N_2$ and Ar permeating selectively over those VOCs with typical selectivity values around 40 were obtained. The absence of any delayed pressure rise inside the Vycor® tube within the 30 minute period after the application of pressure to the outside of the membrane, indicates that adsorption does not play a significant role at the testing temperature of 450° C. An additional 1 hour of film deposition was also performed on membrane VII in order to verify the consistency of the permeability trends, with a view toward potential improvement in $N_2:C_7H_8$ selectivity. FIG. 5 illustrates that after a total deposition time of 5 hours, that the inversion that occurred in the permeabilities of Ar and $N_2$ after 3 hours of deposition persisted. This behavior is believed to be due to the size difference between Ar (3.47 Å) and $N_2$ (3.74 Å) which, for a given pore diameter, would favor a higher Ar permeability. At this stage of deposition, the permeability values for $C_7H_8$ were too low to be differentiated from leaks; consequently, a mass spectrometer was interfaced with the LPCVD reactor in order to monitor trace amounts of VOCs on the permeate side of the membrane. These mass spectrometry measurements failed to show any of the peaks associated with pure $C_7H_8$, $C_6H_{14}$, $CH_2Cl_2$ and $C_2HCl_3$ on the permeate side after a 30 minute test period for 5, 10, and 13.5 Torr input pressures. This indicates that within the detection limits of the mass spectrometer, the VOCs had not permeated the membrane structure of the present invention. These results, together with the fact that $N_2$ peaks were readily observed on the permeate side of the membrane, indicate that selectivity values for $N_2$ and Ar over $C_7H_8$ that are at least equal to those determined from the permeability measurements have been achieved after the 5 hour deposition period. The absence of VOCs on the permeate side of the membrane further confirms that adsorption of these permeants has not occurred and that sieving remains as the primary mechanism of separation.

EXAMPLE 12
Estimation of Average Pore Diameters

For membrane I the permeabilities of $N_2$, Ar and $C_7H_8$ after 48 hours of deposition were very low, indicating that the effective pore diameter of the membrane is very close to the kinetic diameters of these three permeants; and the absence of $N_2$:$C_7H_8$ separation indicates that the average pore size of membrane I is close to that of $N_2$. In the case of membrane VII, on the other hand, a high selectivity between $N_2$ and $C_7H_8$ was observed, suggesting a pore size distribution in the range of 4–6 Å compared to membrane I.

Figure 7:
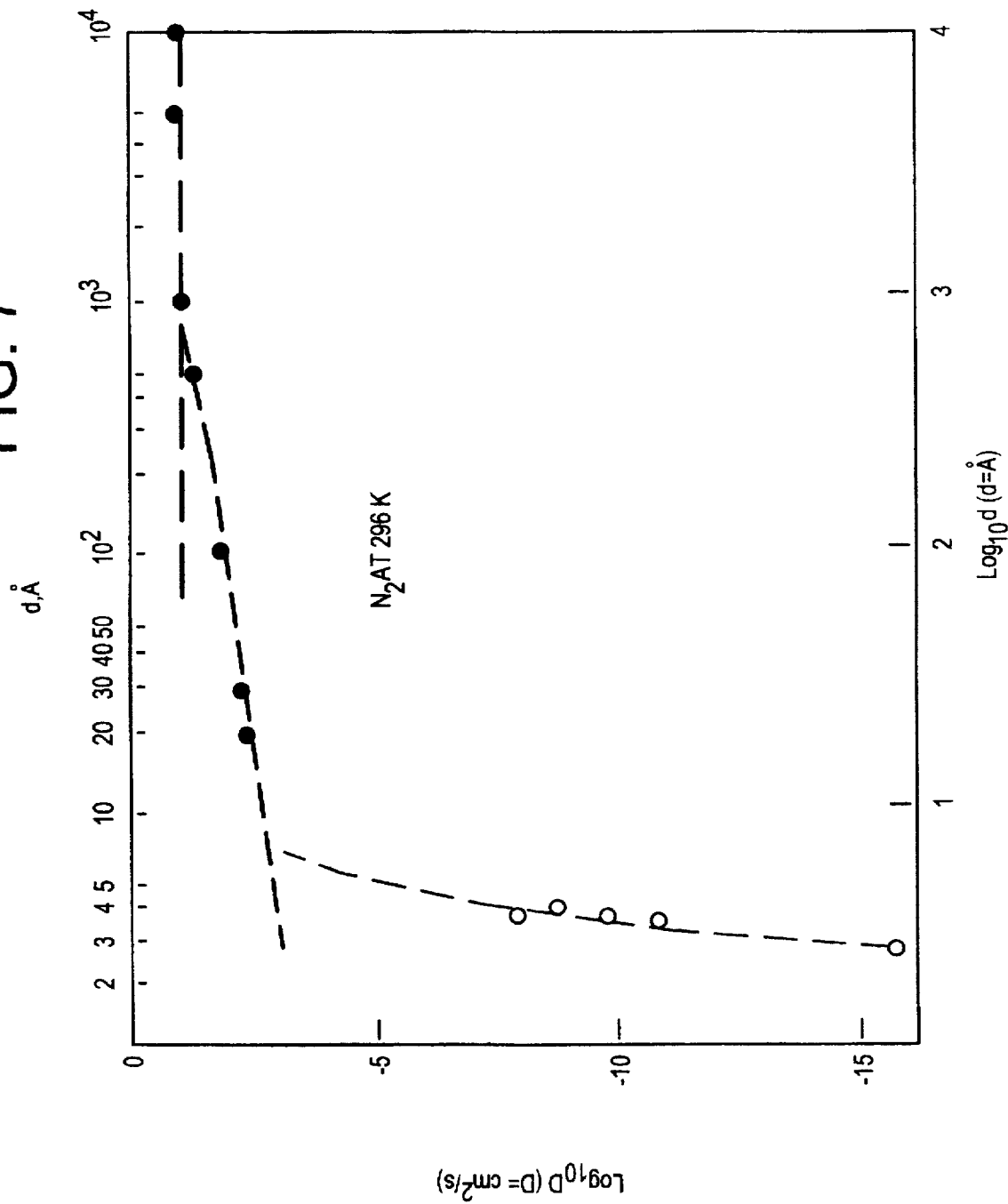
FIG. 7 is a plot of nitrogen diffusivity as a function of pore size used for estimation of the average pore diameter of membranes I and VII.

In order to confirm these pore size range assignments, $N_2$ permeability was measured at room temperature for the purpose of fitting the data to similar measurements made by Rao and Sircar, Gas Separation & Purification, 7, 279 (1993); and J. Membrane Sci., 85, 253 (1993). A plot of $N_2$ diffusivity values at room temperature as a function of pore diameter for membrane structures spanning the mesoporous to microporous range is represented in FIG. 7. It can be seen from this plot, that as the mesoporous range (<20 Å) is approached, $N_2$ diffusivity values drop dramatically due to an activated type of diffusion. The calculated diffusivity values from the permeability of $N_2$ at room temperature were $2.32 \times 10^{-6}$ cm$^2$/s for membrane I and $6.8 \times 10^{-6}$ cm$^2$/s for membrane VII. From these values, the average pore diameters were extrapolated using FIG. 7, and were determined to be ~4 Å and ~5 Å for membranes I and VII, respectively, which was consistent with the assumptions made above. It has been concluded that the lower pore diameter value assigned to membrane I can be attributed to the small diameter of $O_2$ (3.46 Å) used as the oxidant, causing blocking of both $N_2$ and $C_7H_8$ and thus giving lower diffusivity values. The pore diameter assigned to membrane VII is consistent with the high $N_2$:$C_7H_8$ selectivity achieved, since the average pore diameter is exactly between the $N_2$ and $C_7H_8$ kinetic diameters.

The differences in the behavior of membranes I and VII might also be explained in terms of the two types of $SiO_2$ film growth mechanisms postulated by Lin, J. Membrane Sci., 79, 55 (1993). It had been noted that those membranes with high pore narrowing rates, membranes II, VI and VII, were produced by processes that favored powder formation. A theoretical model has been advanced by Lin in accordance with which the deposition mechanism whereby the CVD membrane is modified is classified either as heterogeneous or homogeneous. The rate of pore narrowing resulting from heterogeneous reactions is expected to be independent of pore diameter. Thus, successful modification of a porous membrane by such a mechanism requires a substrate material with a narrow pore size distribution, otherwise, clogging of the smaller pores would occur first. In the case of a homogeneous mechanism, in which the pore narrowing rate is expected to be proportional to pore diameter, the larger pores fill up faster than the smaller ones, which results in a narrower pore size distribution than in the case of the heterogeneous mechanism. The powder formation observed in the case of membranes II, VI and VII is associated with a homogeneous-type mechanism that might be used to explain the enhanced pore narrowing kinetics and selectivity results. In the case of membrane I, in which no powder formation was observed, a heterogeneous mechanism could have led to excessive pore narrowing as shown by the decrease in permeability for all gases including $H_2$ and He.

What is claimed is:

1. A self-terminating low pressure chemical vapor deposition process utilizing opposing reactant geometry, for microengineering the subnancoscale pore structure of a tubular composite membrane filter, comprising a mesoporous borosilicate glass substrate and deposited microporous film predominantly of silicon oxide and optionally silicon carbide or silicon nitride for the purpose of optimizing the stress and other mechanical, chemical, and thermal properties of said composite membrane filter, having high permeability for the filtrate passing therethrough, and a high selectivity for matter retained thereby, as well as having permeability for nitrogen and selectivity for volatile organic compounds which may be entrained with said nitrogen, comprising:

(a) providing a tubular, borosilicate glass, mesoporous substrate substrate having pore diameters in the range of from about 30 Å to about 3000 Å as well pore and other surfaces;

(b) maintaining said substrate as well as other surfaces, both inside and outside thereof, at a temperature in the range of from about 350° C. to about 650° C., and a pressure in the range of from about 400 mTorr to about 600 mTorr;

(c) contacting said inside surfaces, including pore surfaces, of said tubular mesoporous substrate with a reactant gas stream comprising an oxide of nitrogen having a kinetic diameter intermediate in size between the kinetic diameter of said matter retained by said composite membrane filter and the kinetic diameter of said permeant gas passing therethrough, said oxide of nitrogen comprising one or more members selected from the group consisting of nitrous oxide, nitric oxide, nitrogen dioxide, and nitrogen trioxide; and optionally, ammonia or reactive nitrogen-containing gas; and at the same time (d) contacting said outside surfaces, including pore surfaces, of said tubular microporous substrate with a reactant gas stream comprising diethylsilane (DES), $SiH_2(C_2H_5)_2$ or di-t-butylsilane (DTBS), $SiH_2[C(CH_3)_3]_2$;

(e) causing said reactant gas streams to meet within said pores of said tubular microporous substrate, to react, and to deposit thereon a reaction product which by coating the surfaces, including pore surfaces of said mesoporous substrate, substantially reduces the pore diameters thereof, until the pore diameters approach the size of the kinetic diameter of said oxide of nitrogen, at which time said reactant gas streams cannot make contact within the pores, and the reduction of the pore diameters of said tubular mesoporous substrate self-terminates, resulting in a substantially uniform microporous film having pore diameters determined by the kinetic diameter of said oxide of nitrogen in the rang of from about 4 Å to about 7 Å;

said reaction product comprising predominantly silicon oxide, —Si—O—, and optionally including for the purpose of optimizing the stress, and other mechanical, chemical and thermal properties of said film, minor amounts of one or more members, in any combination thereof, selected from the group consisting of polysilicon, —Si—Si—, silicon oxide, —Si—O—, silicon carbide, —Si—C—, and silicon nitride, —Si—N—.

2. A process according to claim 1 wherein said borosilicate glass tubular mesoporous substrate has an average pore diameter of about 40 Å.

3. A process according to claim 1 wherein said tubular mesoporous substrate and an area about it are maintained at a temperature in the range of from about 400° to about 500° C., and at a pressure in the range of from about 450 mTorr to about 550 mTorr.

4. A process according to claim 1 wherein said substantially uniform microporous film has pore diameters in the range of from about 3.0 Å to about 5.0 Å.

5. A process according to claim 1 wherein said optional reactive nitrogen-containing gas is $NH_3$; and said oxide of nitrogen is nitrous oxide, $N_2O$.

* * * * *